(12) United States Patent
Ito et al.

(10) Patent No.: US 11,688,753 B2
(45) Date of Patent: Jun. 27, 2023

(54) SOLID-STATE IMAGING DEVICE CONFIGURED BY ELECTRICALLY BONDING THE RESPECTIVE ELECTRODES OF A PLURALITY OF SEMICONDUCTOR CHIPS

(71) Applicant: SONY SEMICONDUCTOR SOLUTIONS CORPORATION, Kanagawa (JP)

(72) Inventors: Tomomi Ito, Kanagawa (JP); Atsuhiko Yamamoto, Kanagawa (JP); Atsushi Masagaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 27 days.

(21) Appl. No.: 16/500,963

(22) PCT Filed: Feb. 9, 2018

(86) PCT No.: PCT/JP2018/004608
§ 371 (c)(1),
(2) Date: Oct. 4, 2019

(87) PCT Pub. No.: WO2018/189994
PCT Pub. Date: Oct. 18, 2018

(65) Prior Publication Data
US 2020/0035737 A1    Jan. 30, 2020

(30) Foreign Application Priority Data
Apr. 12, 2017   (JP) .............................. JP2017-078701

(51) Int. Cl.
*H01L 27/146*   (2006.01)
*H01L 25/065*   (2023.01)
(Continued)

(52) U.S. Cl.
CPC .... *H01L 27/14634* (2013.01); *H01L 25/0657* (2013.01); *H01L 27/14621* (2013.01);
(Continued)

(58) Field of Classification Search
CPC ............... H01L 25/0657; H01L 25/074; H01L 27/14634; H01L 27/14645;
(Continued)

(56) References Cited

U.S. PATENT DOCUMENTS

2017/0117310 A1   4/2017   Tatani et al.
2018/0033813 A1   2/2018   Suzuki et al.

FOREIGN PATENT DOCUMENTS

| CN | 101848344 | 9/2010 |
|---|---|---|
| CN | 102629616 | 8/2012 |

(Continued)

OTHER PUBLICATIONS

International Search Report and Written Opinion prepared by the European Patent Office dated Apr. 27, 2018, for International Application No. PCT/JP2018/004608.
(Continued)

*Primary Examiner* — Laura M Menz
*Assistant Examiner* — Candice Chan
(74) *Attorney, Agent, or Firm* — Sheridan Ross P.C.

(57) ABSTRACT

An imaging device includes a first chip (72). The first chip includes first and second pixels including respective first and second photoelectric conversion regions (PD) that convert incident light into electric charge. The first chip includes a first connection region for bonding the first chip to a second chip (73) and including a first connection portion (702, 702*d*) overlapped with the first photoelectric conversion region in a plan view, and a second connection portion overlapped with the second photoelectric conversion region in the plan view. The first photoelectric region receives
(Continued)

incident light of a first wavelength, and the second photoelectric conversion region receives incident light of a second wavelength that is greater than the first wavelength. The first connection portion overlaps an area of the first photoelectric conversion region that is larger than an area of the second photoelectric conversion region overlapped by the second connection portion.

10 Claims, 23 Drawing Sheets

(52) U.S. Cl.
CPC .. *H01L 27/14636* (2013.01); *H01L 27/14645* (2013.01); *H01L 2224/081* (2013.01)

(58) Field of Classification Search
CPC ..... H01L 27/14636; H01L 2224/09517; H01L 2224/06517; H01L 2224/80895; H01L 2224/80896
See application file for complete search history.

(56) References Cited

FOREIGN PATENT DOCUMENTS

| | | |
|---|---|---|
| JP | 2006-191081 | 7/2006 |
| JP | 2012-256736 | 12/2012 |
| JP | 2013-187360 | 9/2013 |
| JP | 2015-195235 | 11/2015 |
| JP | 2017022207 A | 1/2017 |
| KR | 20160140597 A | 12/2016 |
| TW | 201703240 | 1/2017 |
| WO | WO 2015/151790 | 10/2015 |
| WO | WO 2016/136488 | 9/2016 |

OTHER PUBLICATIONS

Official Action (with English translation) for Japanese Patent Application No. 2017-078701, dated Oct. 27, 2020, 16 pages.

[Fig. 2]
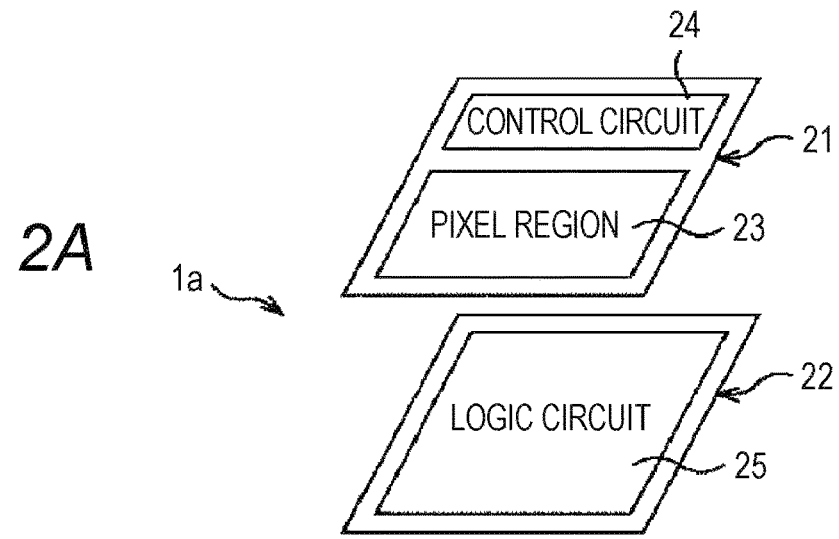
2A
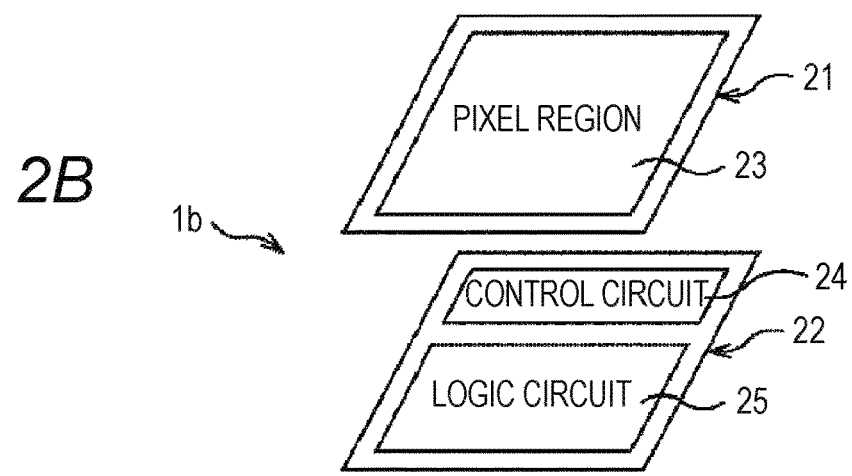
2B
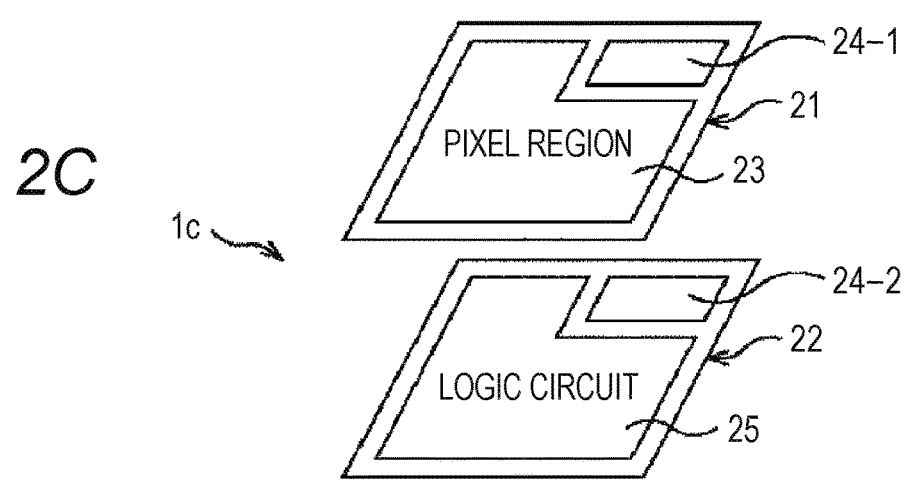
2C

[Fig. 7]
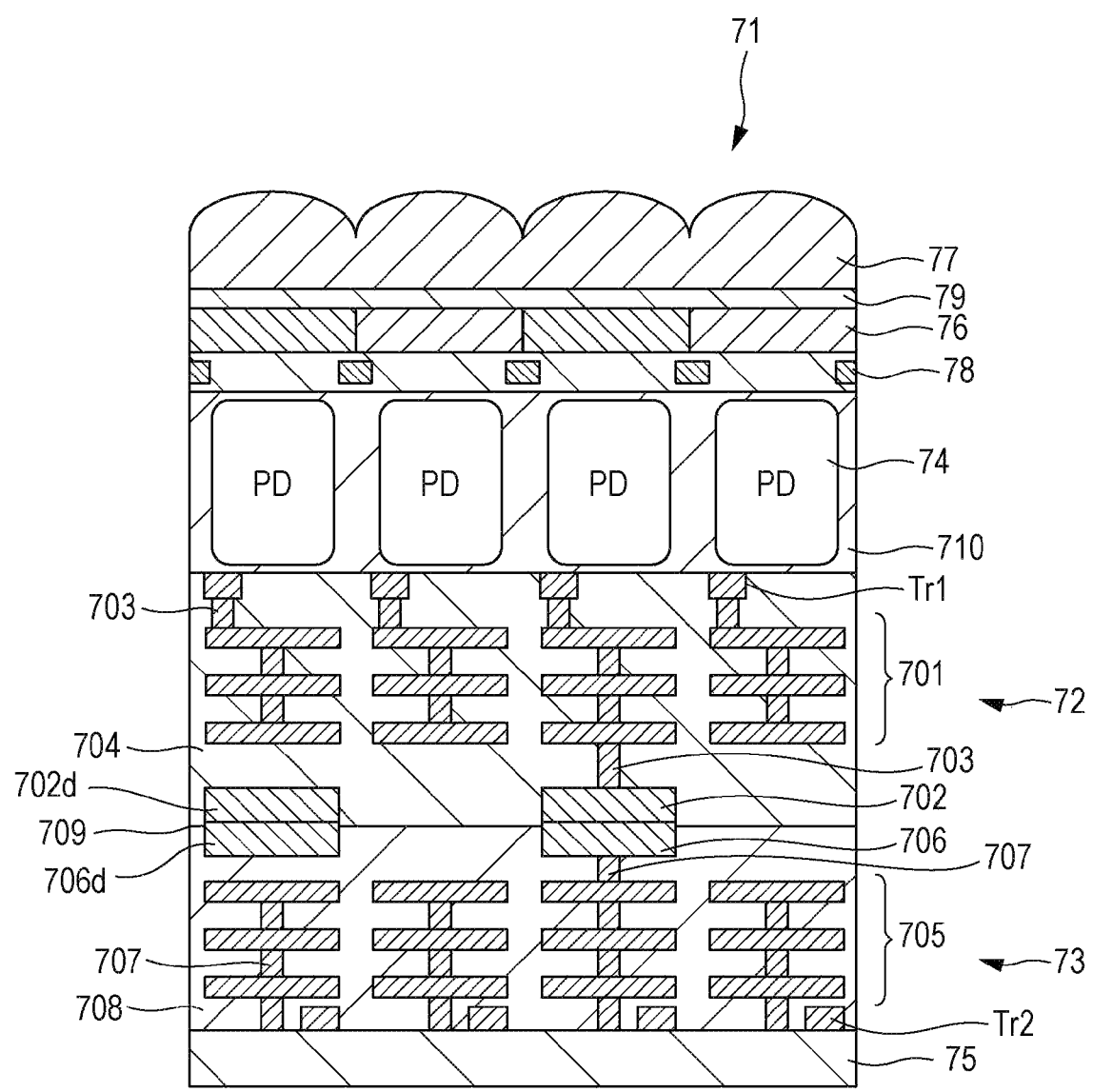

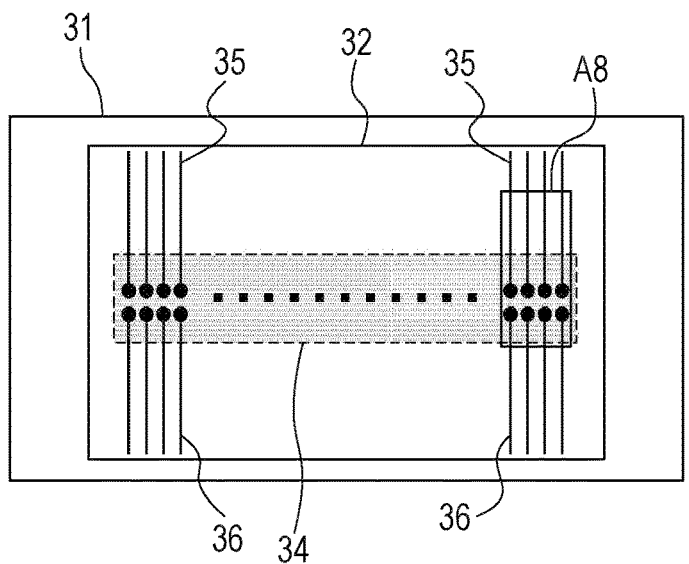
FIG. 8A
FIG. 8B
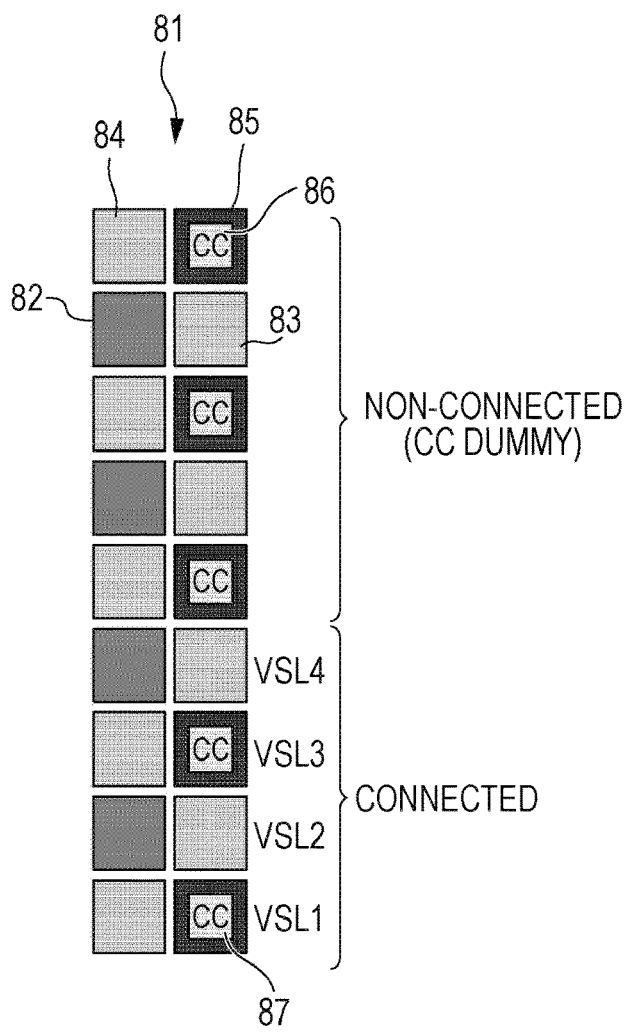
FIG. 8C
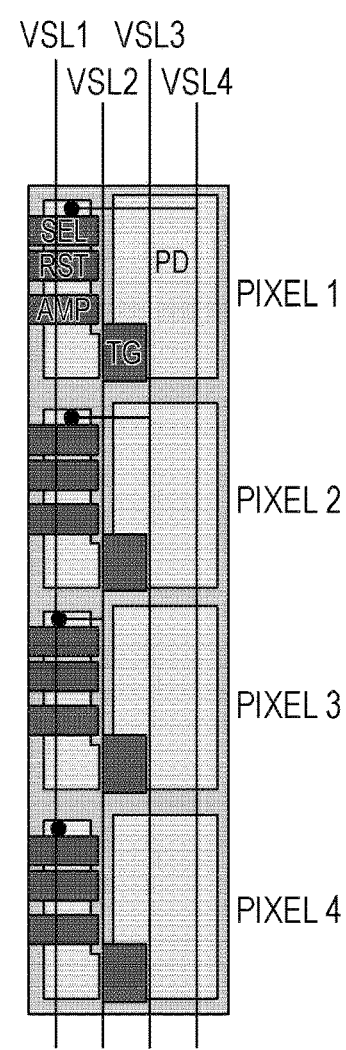

[Fig. 9]
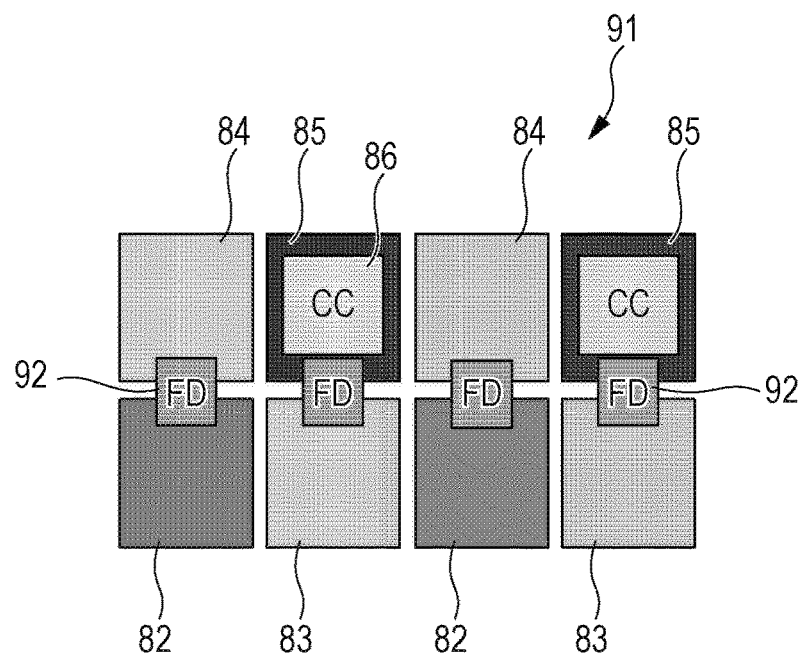
[Fig. 10]
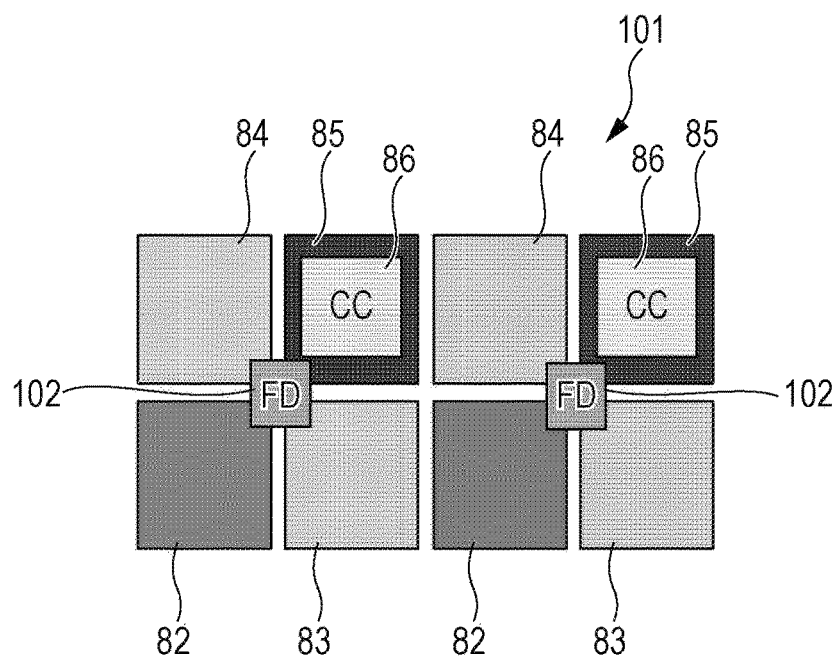

[Fig. 11]
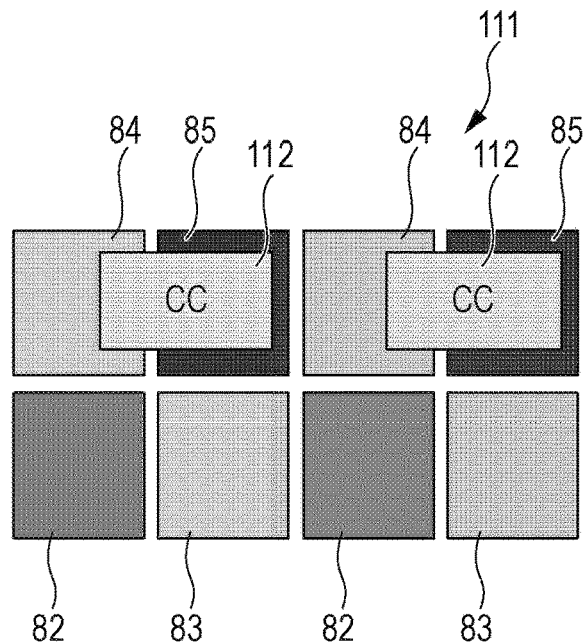
[Fig. 12]
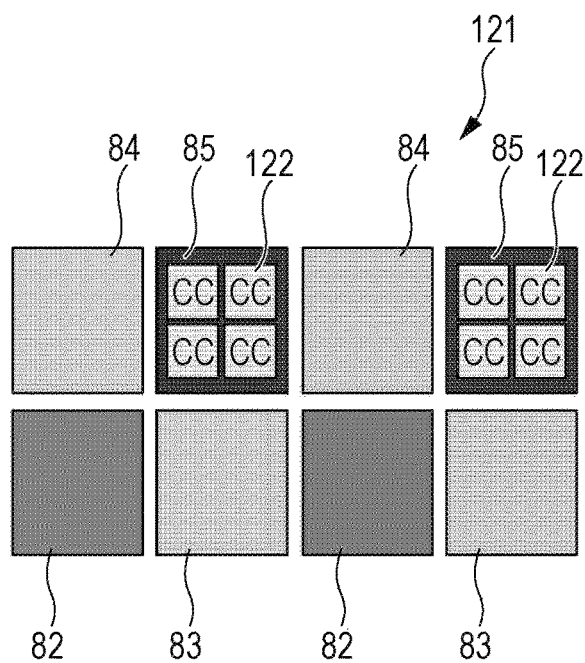

[Fig. 16]
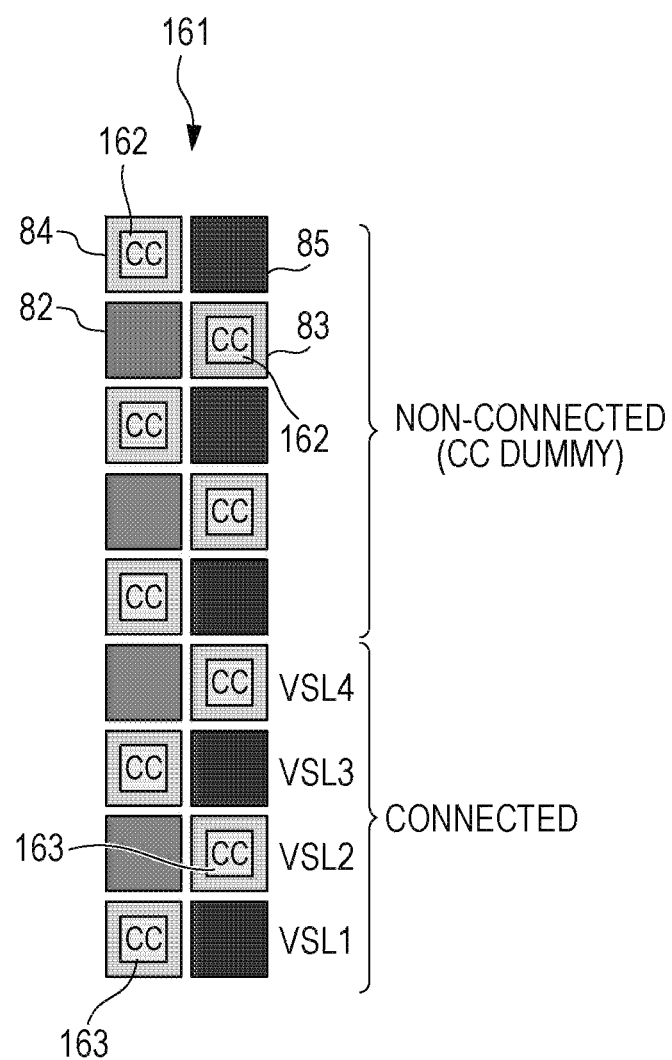

[Fig. 17]
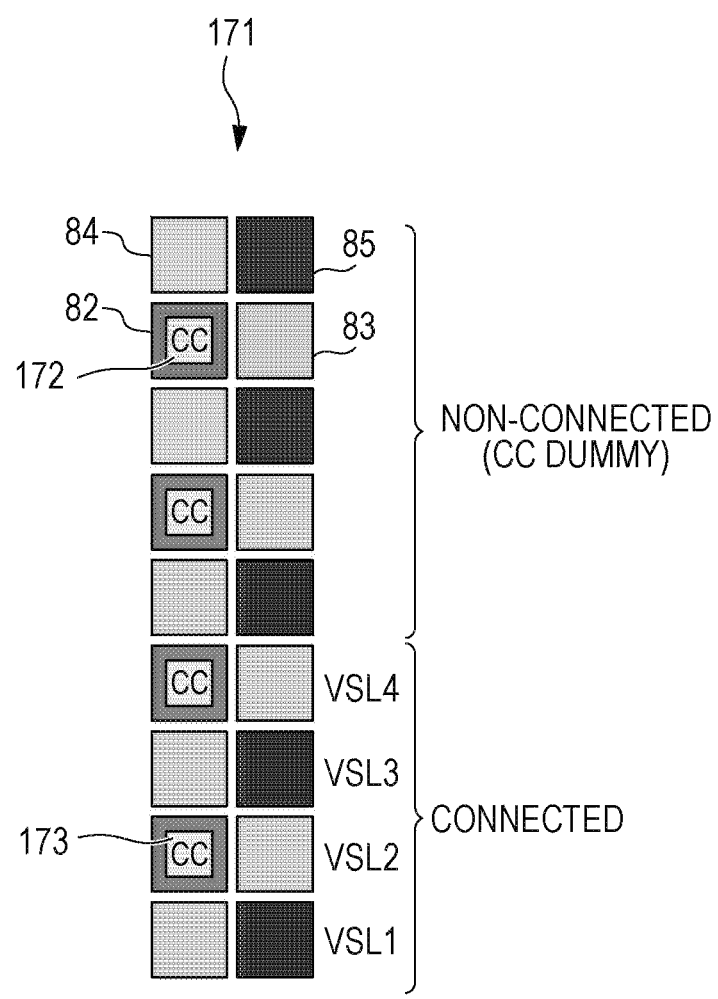

[Fig. 18]
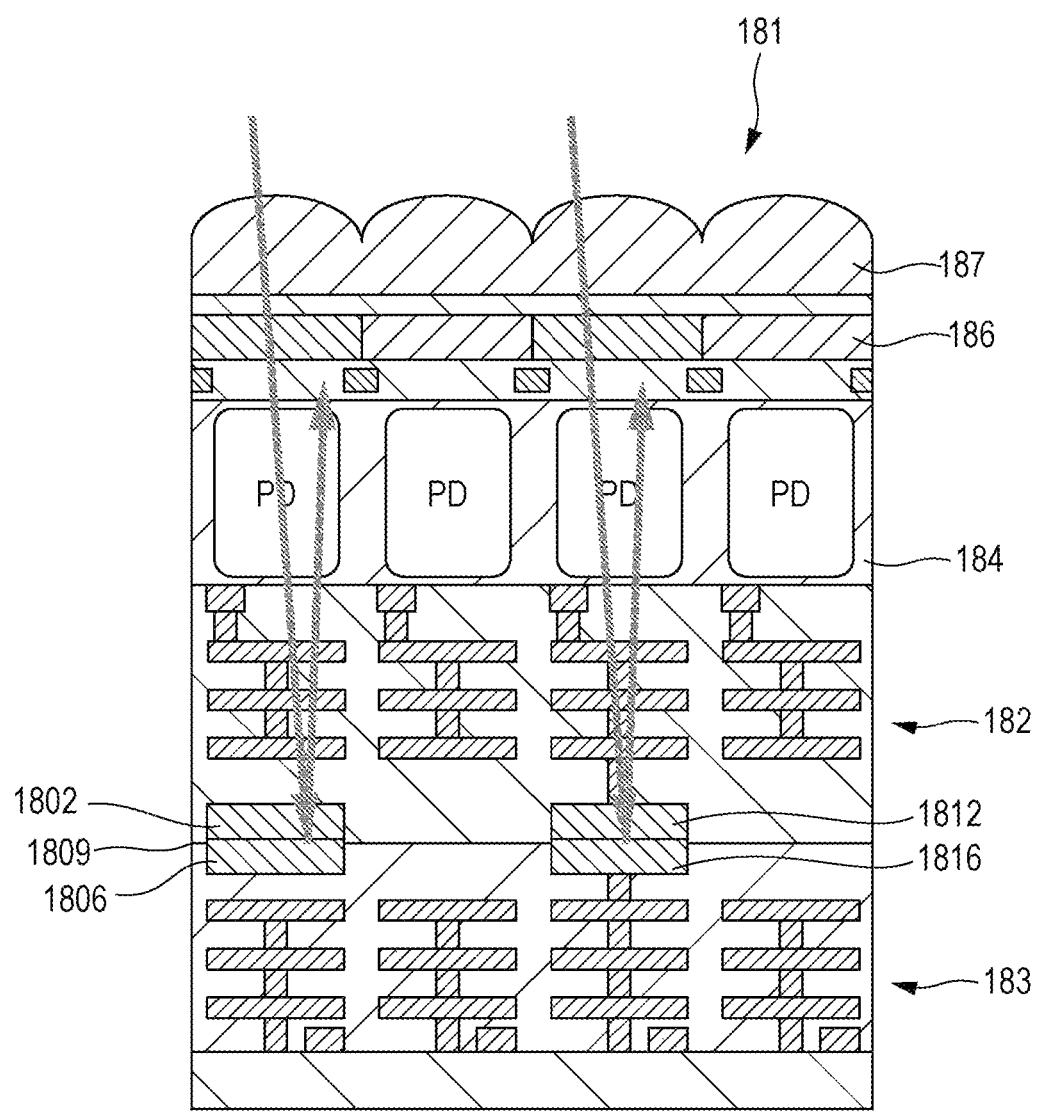

[Fig. 20]
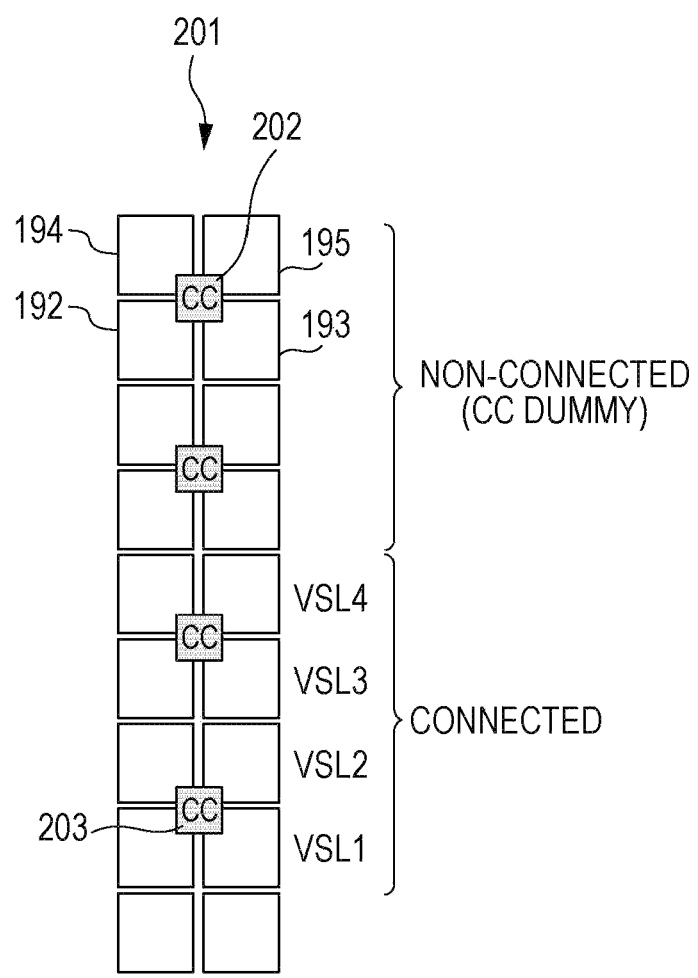

[Fig. 21]
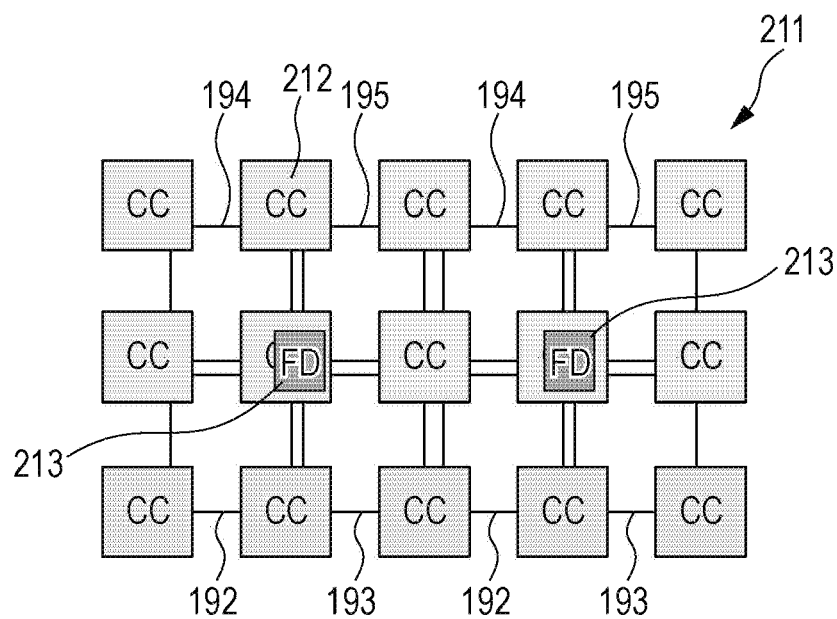
[Fig. 22]
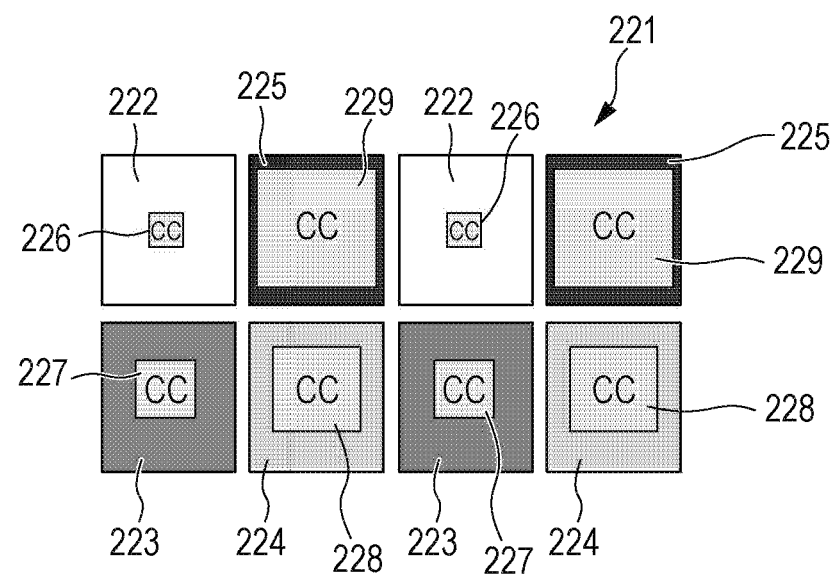

[Fig. 23]
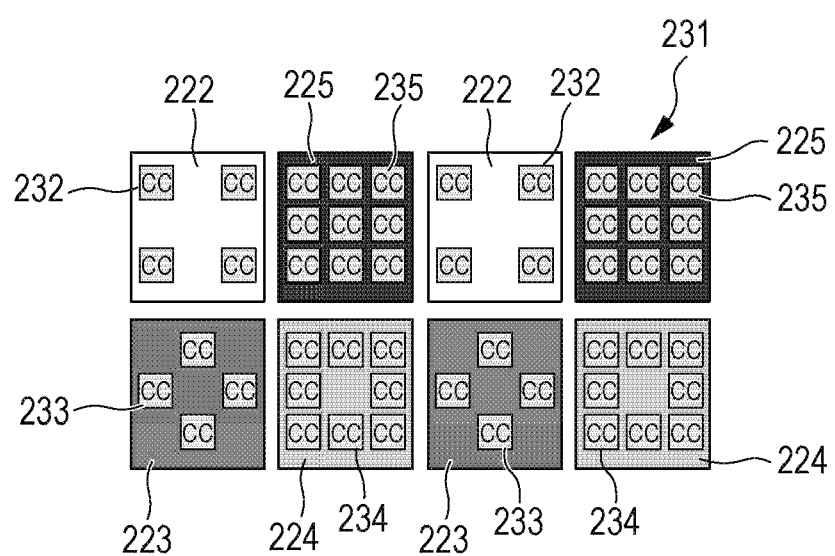

[Fig. 25]
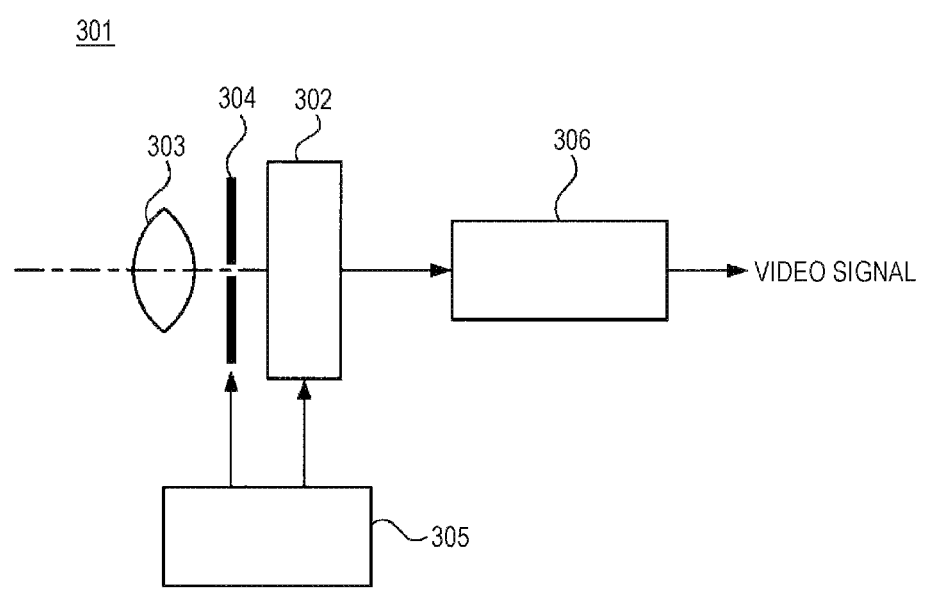

SOLID-STATE IMAGING DEVICE CONFIGURED BY ELECTRICALLY BONDING THE RESPECTIVE ELECTRODES OF A PLURALITY OF SEMICONDUCTOR CHIPS

CROSS REFERENCE TO RELATED APPLICATIONS

This application is a national stage application under 35 U.S.C. 371 and claims the benefit of PCT Application No. PCT/JP2018/004608 having an international filing date of 9 Feb. 2018, which designated the United States, which PCT application claimed the benefit of Japanese Priority Patent Application No. 2017-078701 filed on 12 Apr. 2017, the disclosures of each of which are incorporated herein by reference.

TECHNICAL FIELD

The present technology relates to a solid-state imaging device, and particularly to a technology for solid-state imaging device configured by electrically bonding the respective electrodes of a plurality of semiconductor chips.

BACKGROUND ART

In the past, in a case where semiconductor devices configured of semiconductor members are bonded to manufacture a 3D integrated circuit, a solid-state imaging device, or the like, a method for directly bonding Cu electrodes provided on a bonding face between the semiconductor devices is used and the bonded Cu electrodes are used as wirings. As an exemplary solid-state imaging device manufactured in such a method, Patent Literature 1 discloses a solid-state imaging device in which a first semi-conductor substrate and a second semiconductor substrate are bonded via Cu electrodes arranged on the respective surfaces and the backside of the first substrate is arranged upward during the bonding and a micro-lens is provided at the uppermost backside of the first substrate. The technique in Patent Literature 1 assumes that the performance of the solid-state imaging device can be largely improved. Incidentally, in a case where a coverage of the Cu electrodes relative to the bonding face between the semiconductor substrates is low in the solid-state imaging device according to Patent Literature 1, flatness of the bonding face can be deteriorated, and an adhesion between the semiconductor substrates can be insufficient.

On the other hand, for example, there is proposed, in Patent Literature 2, a semi-conductor device for bonding a first wiring layer as one semiconductor member and a second wiring layer as the other semiconductor member via Cu-made dummy electrodes by arranging the dummy electrodes on a bonding face between the first wiring layer and the second wiring layer. The technique in Patent Literature 2 assumes that an area where metal bonding is performed can be increased on the bonding face between the first wiring layer and the second wiring layer, thereby enhancing a bonding intensity between the first wiring layer and the second wiring layer.

CITATION LIST

Patent Literature

PTL 1: JP 2006-191081A
PTL 2: JP 2012-256736A

SUMMARY

Technical Problem

However, even if the dummy electrodes proposed in Patent Literature 2 are arranged on the bonding face between the semiconductor substrates provided in the solid-state imaging device disclosed in Patent Literature 1, bonding capacitance between pixels is different if the dummy electrodes are irregularly arranged, and the dummy electrodes can be shot on an output image.

The present technology is therefore made in terms of such a situation, and is directed for providing a solid-state imaging device capable of preventing (or alternatively, reducing) a deterioration in optical characteristics and enhancing image quality.

Solution to Problem

According to an embodiment of the present technology, an imaging device comprises a first chip including: first and second pixels including respective first and second photoelectric conversion regions that convert incident light into electric charge, wherein the first and second pixels output pixel signals based on the electric charge; and a first connection region for bonding the first chip to a second chip and including a first connection portion overlapped with the first photoelectric conversion region in a plan view, and a second connection portion overlapped with the second photoelectric conversion region in the plan view. The first photoelectric region receives incident light of a first wavelength, and the second photoelectric conversion region receives incident light of a second wavelength that is greater than the first wavelength. In the plan view, the first connection portion overlaps an area of the first photoelectric conversion region that is larger than an area of the second photoelectric conversion region overlapped by the second connection portion.

Further, an imaging device that is another example of the present technology comprises a first chip including: first and second pixels including respective first and second photoelectric conversion regions that convert incident light into electric charge, wherein the first and second pixels output pixel signals based on the electric charge; and a first connection region for bonding the first chip to a second chip and including a plurality of first connection portions overlapped with the first photoelectric conversion region in a plan view, and a plurality of second connection portions overlapped with the second photoelectric conversion region in the plan view. The first photoelectric conversion region receives incident light of a first wavelength and the second photoelectric conversion region receives incident light of a second wavelength that is greater than the first wavelength, and a number of the first plurality of connection portions is greater than a number of the second plurality of connection portions.

Further, an imaging device that is another example of the present technology comprises a first chip including: first and second pixels including respective first and second photoelectric conversion regions that convert incident light into electric charge and that output pixel signals based on the electric charge; and a first connection region for bonding to a second chip and including a first connection portion overlapped with the first photoelectric conversion region and the second photoelectric conversion region in a plan view. The first photoelectric conversion region converts incident light of a first wavelength and the second photoelectric conversion region converts incident light of a second wavelength that is greater than the first wavelength. The first connection portion overlaps at least a part of the first photoelectric conversion region and at least a part of the second photoelectric conversion region.

Further, an imaging device that is another example of the present technology comprises a first chip including: first and second pixels including respective first and second photoelectric conversion regions that convert incident light into electric charge, wherein the first and second pixels output pixel signals based on the electric charge; and a first connection region for bonding the first chip to a second chip and including a first connection portion overlapped with the first photoelectric conversion region in a plan view, and a second connection portion overlapped with the second photoelectric conversion region in the plan view. The first photoelectric region and the second photoelectric conversion region receive incident light of a first wavelength, and, in the plan view, the first connection portion overlaps an area of the first photoelectric conversion region that is the same as an area of the second photoelectric conversion region overlapped by the second connection portion.

Advantageous Effects of Invention

According to an embodiment of the present technology, it is possible to provide a solid-state imaging device capable of preventing (or alternatively, reducing) a deterioration in optical characteristics and enhancing image quality. Additionally, the effects of the present technology are not limited to the above effects, and any effect described in the present disclosure may be obtained.

BRIEF DESCRIPTION OF DRAWINGS

FIG. 2 is a schematic diagram illustrating laminate structures of solid-state imaging devices according to embodiments of the present technology.

FIG. 7 is a schematic cross-section view illustrating a cross-section structure of the solid-state imaging device according to the first embodiment of the present technology.

FIG. 8A is a plan arrangement diagram illustrating vertical signal lines of the solid-state imaging device according to the first embodiment of the present technology, FIG. 8B is a schematic configuration diagram illustrating an arrangement of electrode pads, and FIG. 8C is a partially-enlarged diagram illustrating wirings of an upper chip of the semiconductor device.

FIG. 9 is an enlarged plan view illustrating a pixel array and electrode pads according to a second embodiment.

FIG. 10 is an enlarged plan view illustrating a pixel array and electrode pads according to a third embodiment.

FIG. 11 is an enlarged plan view illustrating a pixel array and electrode pads according to a fourth embodiment.

FIG. 12 is an enlarged plan view illustrating a pixel array and electrode pads according to a fifth embodiment.

FIG. 16 is a schematic configuration diagram illustrating an arrangement of electrode pads in a solid-state imaging device according to an eighth embodiment.

FIG. 17 is a schematic configuration diagram illustrating an arrangement of electrode pads in a solid-state imaging device according to a ninth embodiment.

FIG. 18 is a schematic cross-section view illustrating a cross-section structure of the solid-state imaging device according to the ninth embodiment.

FIG. 20 is a schematic configuration diagram illustrating an arrangement of electrode pads in a solid-state imaging device according to an eleventh embodiment.

FIG. 21 is a schematic configuration diagram illustrating an arrangement of electrode pads according to a twelfth embodiment.

FIG. 22 is an enlarged plan view illustrating a pixel array and electrode pads according to a thirteenth embodiment.

FIG. 23 is an enlarged plan view illustrating a pixel array and electrode pads according to a fourteenth embodiment.

FIG. 25 is a schematic configuration diagram of an electronic device according to a fifteenth embodiment.

DESCRIPTION OF EMBODIMENTS

Figure 1:
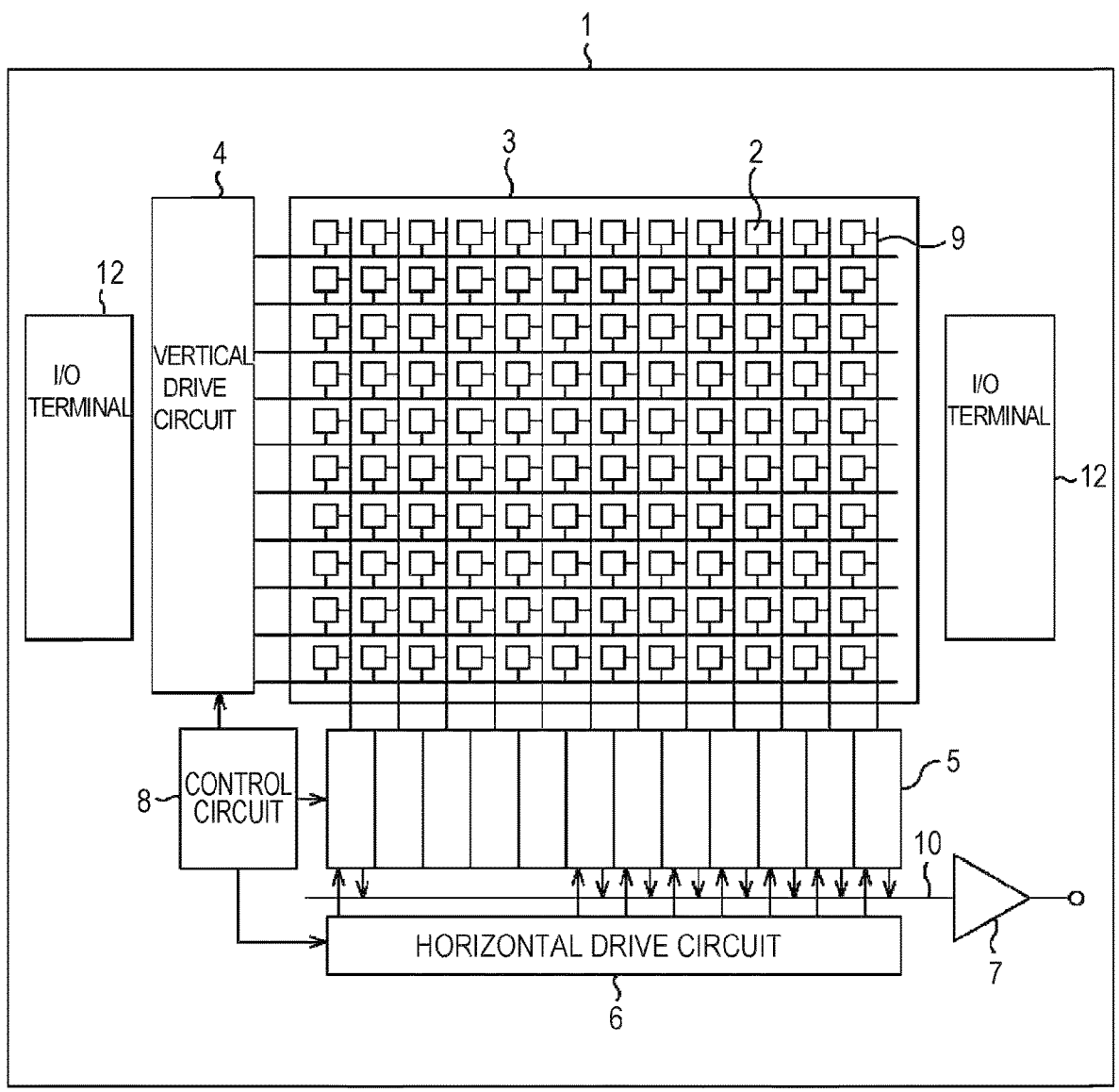
FIG. 1 is a block diagram illustrating an exemplary configuration of a solid-state imaging device according to an embodiment of the present technology.

Preferred embodiments for carrying out the present technology will be described below with reference to the drawings. Additionally, the embodiments described below are exemplary representative embodiments of the present technology, and do not narrow the scope of the present technology.

Note that the description will be made in the following order.

1. Exemplary configuration of solid-state imaging device
2. Exemplary laminate structure of solid-state imaging device
3. Solid-state imaging device according to first embodiment
4. Solid-state imaging device according to second embodiment
5. Solid-state imaging device according to third embodiment
6. Solid-state imaging device according to fourth embodiment
7. Solid-state imaging device according to fifth embodiment
8. Solid-state imaging device according to sixth embodiment
9. Solid-state imaging device according to seventh embodiment
10. Solid-state imaging device according to eighth embodiment
11. Solid-state imaging device according to ninth embodiment
12. Solid-state imaging device according to tenth embodiment
13. Solid-state imaging device according to eleventh embodiment
14. Solid-state imaging device according to twelfth embodiment
15. Solid-state imaging device according to thirteenth embodiment
16. Solid-state imaging device according to fourteenth embodiment
17. Electronic device according to fifteenth embodiment <1. Exemplary Configuration of Solid-State Imaging Device>

FIG. 1 is a block diagram illustrating an exemplary configuration of a solid-state imaging device according to an embodiment of the present technology.

As illustrated in FIG. 1, a solid-state imaging device 1 is configured as a complementary metal oxide semiconductor (CMOS) image sensor, for example. The solid-state imaging device 1 includes a pixel region (pixel array) 3 in which a plurality of pixels 2 are regularly arranged in a 2D array shape on a semiconductor substrate (such as Si substrate) (not illustrated), and peripheral circuit units.

A pixel 2 includes a photoelectric conversion unit (such as photodiode) and a plurality of pixel transistors (MOS transistors). The pixel transistors can be configured of three transistors including transfer transistor, reset transistor, and amplification transistor, for example. Further, the pixel transistors can be configured of four transistors including selection transistor. Additionally, an equivalent circuit of a unit pixel is similar as in a well-known technology, and a detailed description thereof will be omitted.

Further, a pixel 2 can be configured as one unit pixel or can be in a pixel sharing structure. The pixel sharing structure is a structure in which a plurality of photodiodes share a floating diffusion (FD) and the transistors other than the transfer transistor. That is, photodiodes and transfer transistors configuring a plurality of unit pixels share each of the other pixel transistors in the pixel sharing.

The peripheral circuit units include a vertical drive circuit 4, column signal processing circuits 5, a horizontal drive circuit 6, an output circuit 7, and a control circuit 8.

The vertical drive circuit 4 is configured of a shift register, for example. The vertical drive circuit 4 selects a pixel drive wiring, and supplies a pulse for driving the pixels to the selected pixel drive wiring thereby to drive the pixels in units of row. That is, the vertical drive circuit 4 selects and scans the pixels 2 in the pixel array 3 in units of row sequentially in the vertical direction. The vertical drive circuit 4 then supplies the column signal processing circuits 5 with a pixel signal based on a signal charge generated depending on the amount of light received in the photoelectric conversion unit in each pixel 2 via vertical signal lines 9.

A column signal processing circuit 5 is arranged per column of pixels 2, for example. The column signal processing circuit 5 performs a signal processing such as noise cancellation on a signal output from one row of pixels 2 per column of pixels. Specifically, the column signal processing circuits 5 perform signal processing such as correlated double sampling (CDS), signal amplification, and analog/digital (AD) conversion for canceling a fixed pattern noise specific to the pixels 2. A horizontal selection switch (not illustrated) is provided at an output stage of a column signal processing circuit 5 to be connected to a horizontal signal line 10.

The horizontal drive circuit 6 is configured of a shift register, for example. The horizontal drive circuit 6 sequentially outputs horizontal scanning pulses, and selects in turn and causes the column signal processing circuits 5 to output the pixel signals from the respective column signal processing circuits 5 to the horizontal signal line 10.

The output circuit 7 performs a signal processing on the signals sequentially supplied from each of the column signal processing circuits 5 via the horizontal signal line 10 and outputs the signals. The output circuit 7 may perform only buffering, or may make black level adjustment, make column variation correction, perform various digital signal processing, and the like, for example.

The control circuit 8 receives an input clock and data for instructing an operation mode and the like, and outputs data such as internal information of the solid-state imaging device 1. Further, the control circuit 8 generates a clock signal or a control signal which is a reference of the operations of the vertical drive circuit 4, the column signal processing circuits 5, the horizontal drive circuit 6, and the like on the basis of a vertical synchronization signal, a horizontal synchronization signal, and a mater clock. The control circuit 8 then inputs the signals into the vertical drive circuit 4, the column signal processing circuits 5, the horizontal drive circuit 6, and the like.

I/O terminals 12 exchange signals with the outside.

<2. Exemplary Laminate Structure of Solid-State Imaging Device>

FIGS. 2A to 2C are schematic diagrams illustrating exemplary laminate structures of solid-state imaging devices according to embodiments of the present technology. Exemplary laminate structures of solid-state imaging devices according to embodiments of the present technology will be described with reference to FIGS. 2A to 2C.

As a first example, a solid-state imaging device 1a illustrated in FIG. 2A is configured of a first semiconductor substrate 21 and a second semiconductor substrate 22. The first semiconductor substrate 21 is mounted with a pixel array 23 and a control circuit 24. The second semiconductor substrate 22 is mounted with logic circuits 25 including the signal processing circuits. The first semiconductor substrate 21 and the second semiconductor substrate 22 are then electrically connected to each other thereby to configure the solid-state imaging device 1a as one semiconductor chip.

As a second example, a solid-state imaging device 1b illustrated in FIG. 2B is configured of the first semiconductor substrate 21 and the second semiconductor substrate 22. The first semiconductor substrate 21 is mounted with the pixel array 23. The second semiconductor substrate 22 is mounted with the control circuit 24 and the logic circuits 25 including the signal processing circuits. The first semiconductor substrate 21 and the second semiconductor substrate 22 are then electrically connected to each other thereby to configure the solid-state imaging device 1b as one semiconductor chip.

As a third example, a solid-state imaging device 1c illustrated in FIG. 2C is configured of the first semiconductor substrate 21 and the second semiconductor substrate 22. The first semiconductor substrate 21 is mounted with the pixel array 23, and a control circuit 24-1 for controlling the pixel array 23. The second semiconductor substrate 22 is mounted with a control circuit 24-2 for controlling the logic circuits 25, and the logic circuits 25 including the signal processing circuits. The first semi-conductor substrate 21 and the second semiconductor substrate 22 are then electrically connected to each other thereby to configure the solid-state imaging device 1c as one semiconductor chip.

Though not illustrated, two or more semiconductor chip parts can be adhered to configure a CMOS image sensor depending on a configuration of the CMOS image sensor. For example, in addition to the first and second semiconductor chip parts, a semiconductor chip part including a memory device array, a semiconductor chip part including other circuit device, and the like are added to adhere three or more semi-conductor chip parts, thereby configuring a CMOS image sensor as one chip.

Exemplary Configuration of Solid-State Imaging Device

<3.Solid-State Imaging Device According to First Embodiment>

Figure 3A:
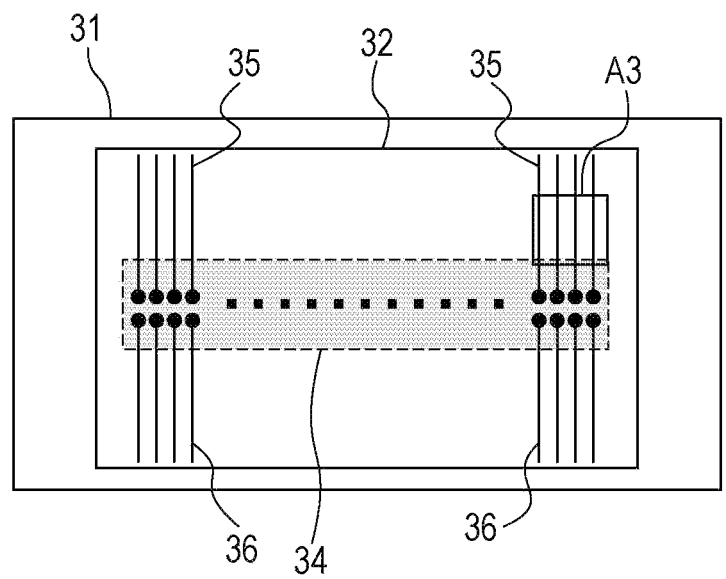
FIG. 3A is a plan arrangement diagram illustrating vertical signal lines of a solid-state imaging device according to a first embodiment of the present technology.
Figure 3B:
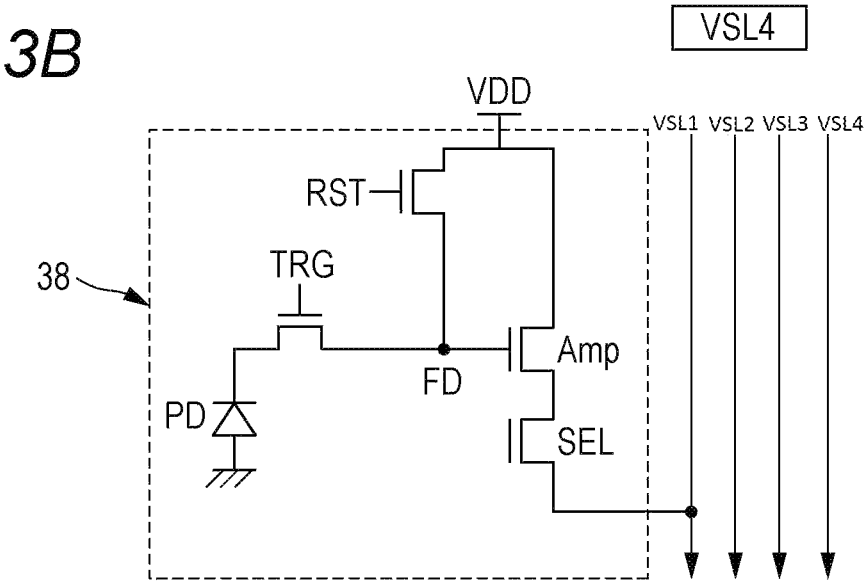
FIG. 3B is a circuit configuration diagram of each pixel in a pixel array.
Figure 3C:
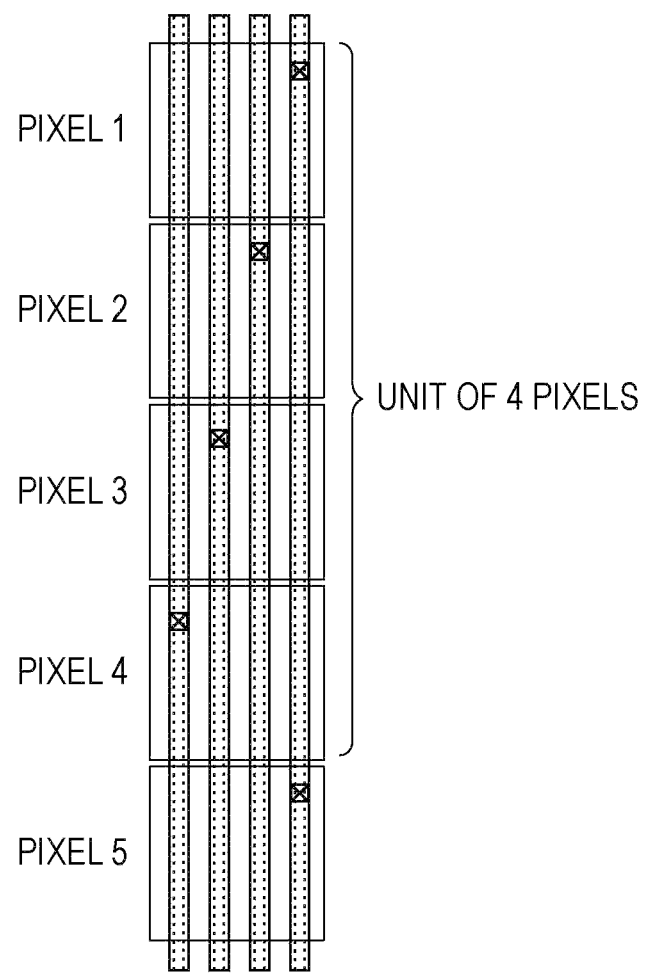
FIG. 3C is a partially-enlarged diagram illustrating wirings of an upper chip of the semiconductor device.

An exemplary configuration of part of a solid-state imaging device (image sensor) according to a first embodiment of the present technology will be described with reference to FIGS. 3A to 3C. FIG. 3A is a plan arrangement diagram illustrating vertical signal lines of a first semiconductor chip (upper chip) provided in the solid-state imaging device according to the present embodiment. FIG. 3B is a circuit configuration diagram of each pixel in a pixel array provided in the first semiconductor chip, and FIG. 3C is a partially-enlarged diagram illustrating wirings of the first semiconductor chip. Additionally, the solid-state imaging device according to the present embodiment is a solid-state imaging device capable of imaging an object and obtaining digital data of the shot image, such as complementary metal oxide semiconductor (CMOS) image sensor or charge coupled device (CCD) image sensor.

As illustrated in FIG. 3A, a first semiconductor chip 31 includes a pixel array region 32, a Cu—Cu electrode bonding region (CC bonding region) 34, and output lines (VSL) 35 and 36 as vertical signal lines. The output lines (VSL) 35 and 36 are each divided at the center of the first semiconductor chip 31 thereby to be divided into the upper output lines (VSL) 35 and the lower output lines (VSL) 36.

The pixel array region 32 is a pixel region in which pixel configurations having photoelectric conversion devices such as photodiodes are arranged in an array (matrix) shape. The pixel array region 32 is controlled by a control unit (not illustrated), receives a light of an object at each pixel, photoelectrically converts the incident light thereby to accumulate charges, and outputs the charges accumulated in each pixel as a pixel signal at a predetermined (or alternatively, desired) timing.

As illustrated in FIG. 3B, pixels 38 arranged in the pixel array region 32 are each configured of a photodiodes(PD), a transfer switch (TRG), a floating diffusion (FD), a MOS amplifier (Amp), a selection switch (SEL), and a reset switch (RST). The pixels 38 are then connected to a power supply voltage (VDD).

FIG. 3C illustrates wirings in a region A3 of FIG. 3A. At first, as illustrated in FIG. 3C, the pixels 38 having the configuration of FIG. 3B are continuously arranged per column like pixel 1 to pixel 5, for example, in the pixel array region 32.

Then as illustrated in FIGS. 3B and 3C, the pixel array region 32 is provided with four (four systems of) output lines (VSL) per column by way of example. The circuits of the pixel 1 to the pixel 5 in FIG. 3C are connected to the four systems of output lines VSL1 to VSL4 by four rows. That is, the circuits of the pixels 1 to 5 are connected to the output lines VSL1 to VSL4 of the same system every fifth rows in units of four pixels. In FIG. 3C, the pixel 4 is connected to the first output line (VSL1), the pixel 3 is connected to the second output line (VSL2), the pixel 2 is connected to the third output line (VSL3), and the pixel 1 and the pixel 5 are connected to the fourth output line (VSL4).

Exemplary Laminate of Solid-State Imaging Device

Figure 4A:
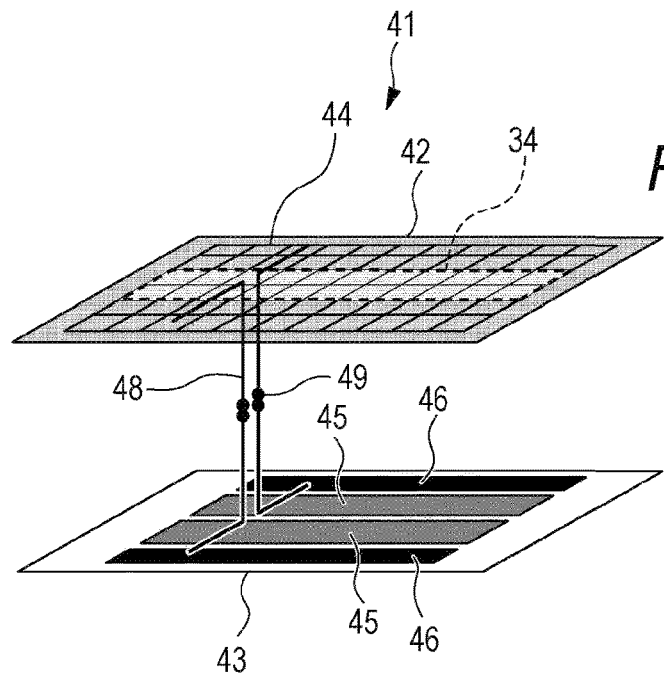
FIG. 4A is an arrangement diagram illustrating a plan arrangement of circuit blocks of the solid-state imaging device according to the first embodiment of the present technology.

An exemplary laminate of part of the solid-state imaging device according to the present embodiment will be described with reference to FIGS. 4A to 4C and 5A to 5C. FIG. 4A is an arrangement diagram illustrating a plan arrangement of circuit blocks in the solid-state imaging device according to the present embodiment, FIG. 4B is an arrangement diagram illustrating the upper chip of the semiconductor device, and FIG. 4C is an arrangement diagram of the lower chip of the semiconductor device.

At first, the shapes of the transistors formed on a typical solid-state imaging device do not take their designed shapes and the dimensions thereof can be distributed with their dispersion due to a variation in manufacture, particularly a variation in manufacture in the lithography step. Further, there is a trend in which the dispersion is generally small when a region where a plurality of transistors to be formed are arranged is small, and the dispersion is large when a region where a plurality of transistors to be formed are arranged is large. Moreover, when the signal processing circuits used in the solid-state imaging device are compared with a memory, the dispersion in dimension of the respective parts of the transistors is small for the memory in which the transistors are regularly and repeatedly arranged, and the dispersion in dimension of the respective parts of the transistors easily increases for the signal processing circuits in which transistors with various sizes are irregularly arranged. Then, in a case where an analog signal processing circuit is compared with a digital signal processing circuit, an adverse effect on the characteristics of the circuits is more serious in the analog signal processing circuit than in the digital signal processing circuit in a case where the transistors do not have their designed shapes.

Thus, as illustrated in FIG. 4A, a CMOS image sensor (CIS) 41 as the solid-state imaging device according to the present embodiment is configured such that a plurality of chips including a first semiconductor chip 42 having a pixel array 44 and a second semiconductor chip 43 having at least some of the signal processing circuits are bonded and laminated.

Figure 4B:
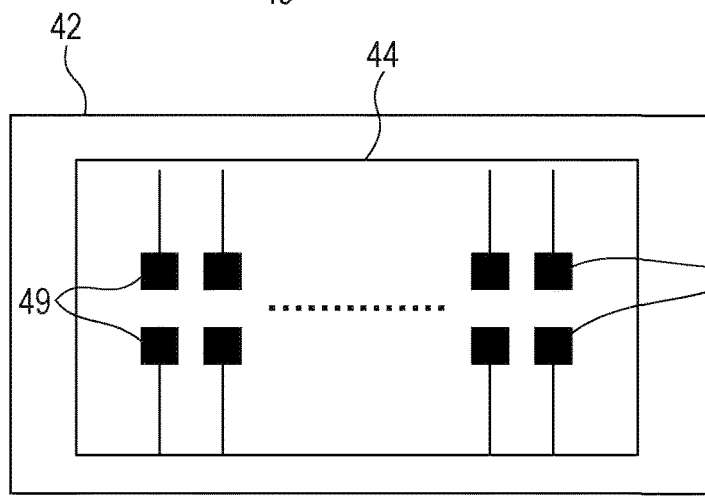
FIG. 4B is an arrangement diagram illustrating an upper chip of the semiconductor device.
Figure 4C:
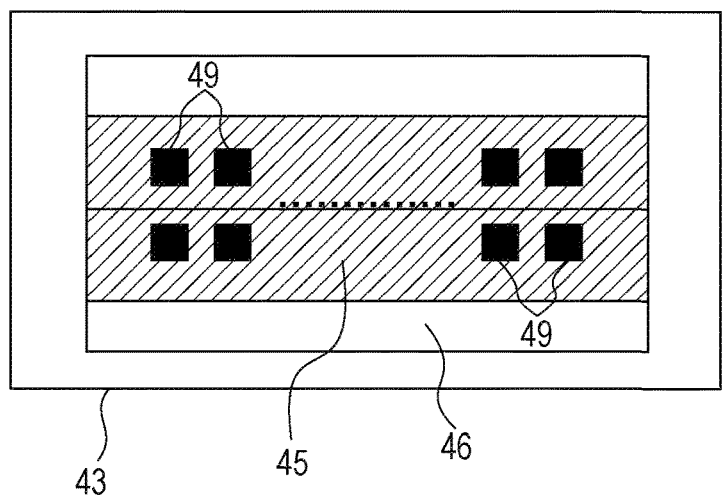
FIG. 4C is an arrangement diagram illustrating a lower chip of the semiconductor device.

As illustrated in FIG. 4A and FIG. 4B, the first semiconductor chip 42 is mainly arranged with the pixel array 44. As illustrated in FIG. 4A and FIG. 4C, the second semiconductor chip 43 is arranged below the first semiconductor chip 42. The second semiconductor chip 43 is collectively arranged with an analog digital converter (AD converter: ADC) 45, logic circuits 46 outside the AD converter 45 in the width direction, and an analog signal processing circuit below the center of the pixel array 44.

As illustrated in FIG. 4A, the first semiconductor chip 42 and the second semi-conductor chip 43 are connected to each other via Cu—Cu electrode bonding parts (CC bonding parts) 49 in which electrode pads of the chips are bonded. The output lines of the first semiconductor chip 42 are connected to the AD converter 45 in the second semiconductor chip 43 via conductive vias 48 and the CC bonding parts 49.

That is, the second semiconductor chip (lower chip) 43 includes an analog circuit such as the ADC 45 configured to AD-convert a signal read from a pixel in units of repetition when each column of the pixel array 44 is assumed as repetition unit and corresponds thereto or when a width of sharing unit is assumed as repetition unit and corresponds thereto in a case where a pixel sharing structure in which one floating diffusion (FD) is shared by a plurality of pixels is provided (hereinafter, the analog circuit provided in units of repetition will be called "column signal processing circuit" for convenience).

Further, the second semiconductor chip 43 includes, in addition to the column signal processing circuits, a digital circuit for signal processing in units of repetition, or in a configuration of being shared in units of repetitions, or in a configuration of being shared by the entire pixel array 44.

Alternatively, the second semiconductor chip 43 includes a memory in units of repetition, in a configuration of being shared in units of repetitions, or in a configuration of being shared by the entire pixel array 44.

The second semiconductor chip 43 is then arranged with the column signal processing circuits such that in a case where a rectangle with the same size as the area of the pixel array 44 is evenly divided into first to fourth regions in a direction in which the vertical signal lines of the pixel array 44 extend, the proportion of the area occupied by the column signal processing circuits in the second and third regions in the second and third regions arranged inside the rectangle is larger than the proportion of the area occupied by the column signal processing circuits in the first and fourth regions in the first and fourth regions arranged outside the rectangle.

With the above arrangement, the CMOS image sensor 41 according to the present embodiment is such that the column signal processing circuits are intensively arranged in a narrower region than in a typical technology. Thereby, there is provided an effect that the shapes of the transistors provided in the column signal processing circuits are closer to the designed values than in the typical technology, and thus the characteristics of the column signal processing circuits are closer to the designed values than in the typical technology.

Further, with the above configuration, the CMOS image sensor 41 according to the present embodiment can downsize the semiconductor chips and reduce the cost. Further, the wiring layers have an enough space, and thus the wirings can be easily drawn. Moreover, a plurality of chips are provided thereby to optimize each chip. For example, it is possible to realize a multilayer configuration with less wiring layers in order to prevent (or alternatively, mitigate) a reduction in quantum efficiency due to optical reflection by the wiring layers in the pixel chips, and to realize a multilayer configuration of wiring layers in order to optimize inter-wiring coupling and the like in the lower chip 43.

Further, in a case of a solid-state imaging device of backside irradiation type, optical reflection is not caused by the wiring layers, but an increase in wiring steps or the like can be restricted and a reduction in cost can be realized by preventing (or alternatively, reducing) an increase in unnecessary wiring layers.

Additionally, the solid-state imaging device according to an embodiment of the present technology is not limited to the above configuration, and may have other configurations.

Figure 5A:
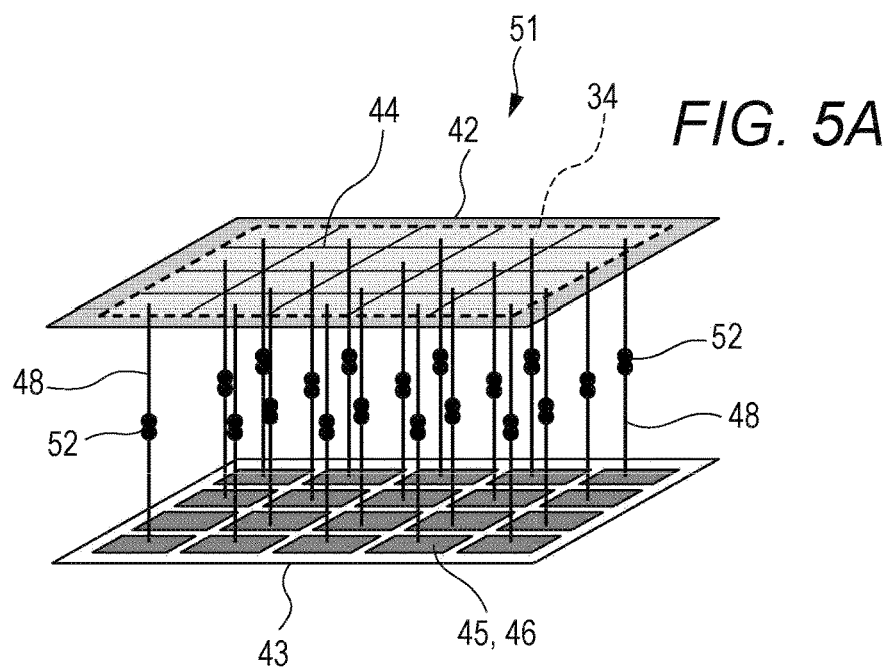
FIG. 5A is an arrangement diagram illustrating a plan arrangement of circuit blocks of the solid-state imaging device according to a variant of the first embodiment of the present technology.
Figure 5B:
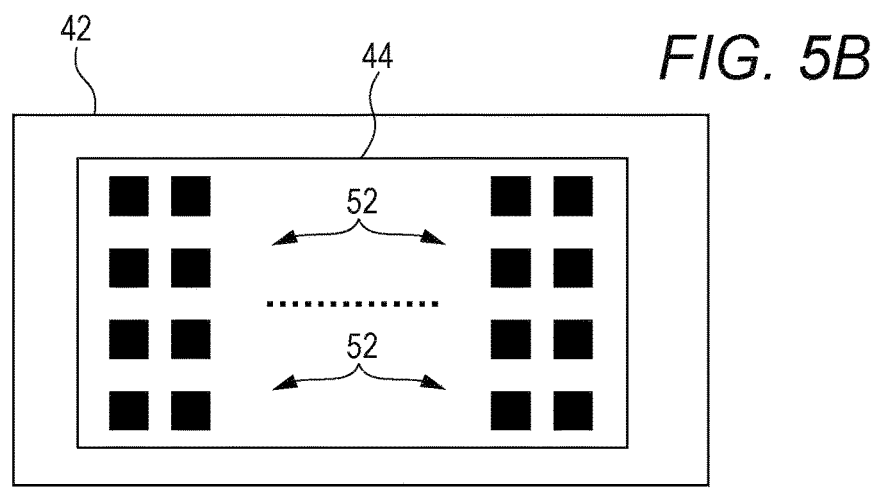
FIG. 5B is an arrangement diagram illustrating an upper chip of the semiconductor device.
Figure 5C:
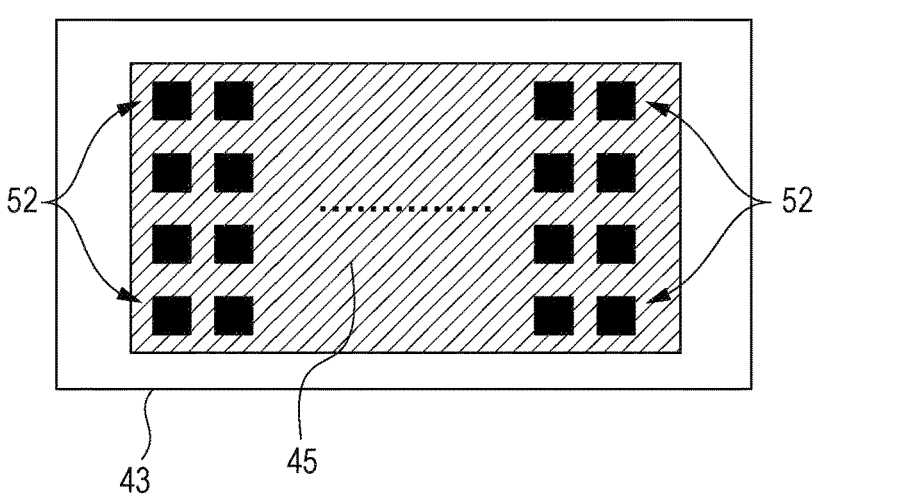
FIG. 5C is an arrangement diagram illustrating a lower chip of the semiconductor device.

FIG. 5A is an arrangement diagram illustrating a plan arrangement of circuit blocks of a solid-state imaging device according to a variant of the present embodiment, FIG. 5B is an arrangement diagram illustrating the upper chip of the semiconductor device, and FIG. 5C is an arrangement diagram illustrating the lower chip of the semiconductor device.

As illustrated in FIG. 5A, in a CMOS image sensor 51 according to a variant of the present embodiment, all the pixels in the pixel array 44 in the first semiconductor chip 42 are connected to the AD converter 45 and the logic circuit 46 in the second semi-conductor chip 43 via the conductive vias 48 and CC bonding parts 52.

The CC bonding parts 52 are arranged in the entire region of the pixel array 44 to be connected to the second semiconductor chip 43 so that the CMOS image sensor 51 can reduce loads on the vertical signal lines and can realize higher speed.

Cross-Section Structure of Typical Solid-State Imaging Device

Figure 6A:
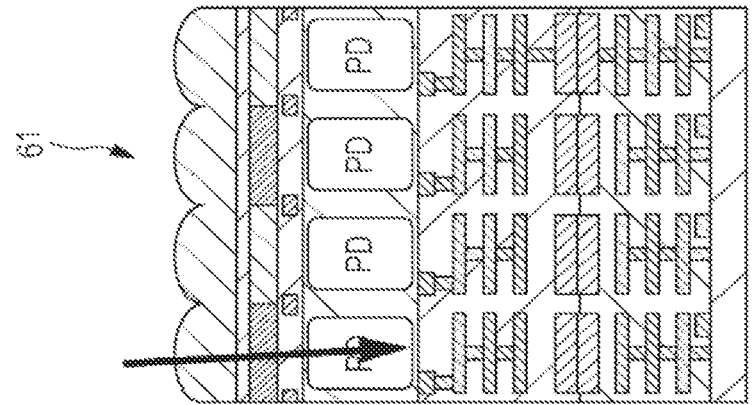
FIG. 6A is a cross-section view illustrating an incident light from a red pixel of a typical solid-state imaging device.
Figure 6B:
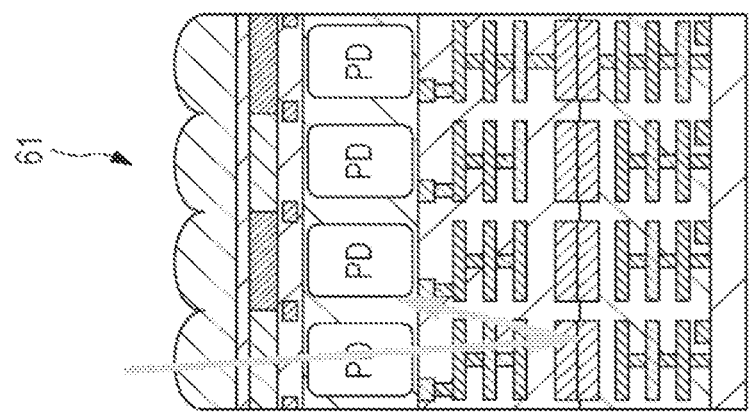
FIG. 6B is a cross-section view illustrating an incident light from a green pixel.
Figure 6C:
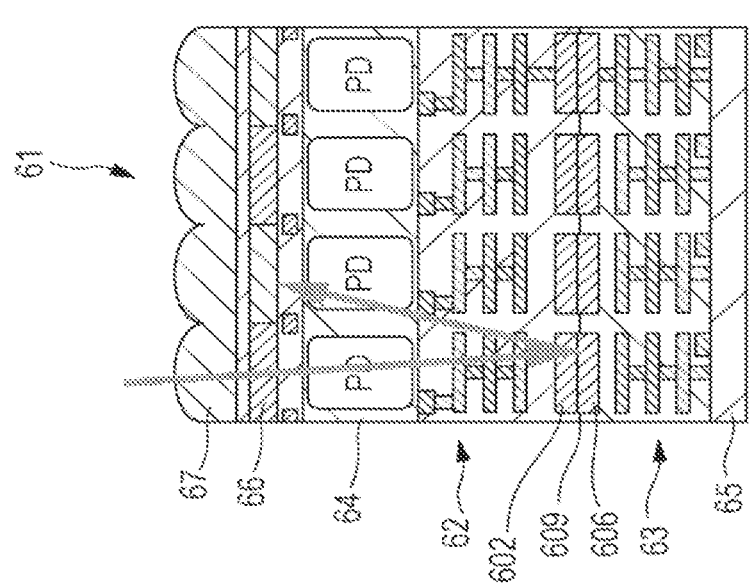
FIG. 6C is a cross-section view illustrating an incident light from a blue pixel.

FIG. 6A is a cross-section view illustrating an incident light from a red pixel of a typical solid-state imaging device, FIG. 6B is a cross-section view illustrating an incident light from a green pixel of the typical solid-state imaging device, and FIG. 6C is a cross-section view illustrating an incident light from a blue pixel of the typical solid-state imaging device.

As illustrated in FIG. 6A, a typical CMOS solid-state imaging device 61 of backside irradiation type includes a laminate semiconductor chip in which a first semiconductor chip part 62 forming a pixel array and a control circuit thereon is adhered to a second semiconductor chip part 63 forming logic circuits thereon.

The first semiconductor chip part 62 is such that the pixel array configured of photodiodes PD as photoelectric conversion units and a plurality of pixel transistors is formed on a silicon-made first semiconductor substrate 64. A color filter 66 and an on-chip lens 67 are further formed on the pixel array. The second semiconductor chip part 63 is such that the logic circuits configuring the peripheral circuits are formed in the regions of the respective semiconductor chip parts on a silicon-made second semi-conductor substrate 65.

Metal-made first electrode pads 602 are formed on the first semiconductor chip part 62 to face a bonding face 609 with the second semiconductor chip part 63. Metal-made second electrode pads 606 are formed on the second semiconductor chip part 63 to face the bonding face 609 with the first semiconductor chip part 62. Then, the first electrode pads 602 and the second electrode pads 606, which face the bonding face 609, are directly bonded to each other, and thus the first semiconductor chip part 62 is electrically connected to the second semiconductor chip part 63 such that the multilayered wiring layers thereof face each other.

The left end of the color filter 66 in FIG. 6A indicates a red pixel, red pixels and green pixels are alternately arranged from the left end, and a green pixel is arranged at the right end. Similarly, the left end of the color filter 66 in FIG. 6B indicates a green pixel, green pixels and blue pixels are alternately arranged from the left end, and a blue pixel is arranged at the right end. Further, the left end of the color filter 66 in FIG. 6C indicates a blue pixel, blue pixels and green pixels are alternately arranged from the left end, and a green pixel is arranged at the right end. The Cu—Cu electrode bonding parts (CC bonding parts) between the first electrode pads 602 and the second electrode pads 606 are then arranged below all of the red pixels, the green pixels, and the blue pixels.

Part of a light incident in a photodiode PD of the thus-configured solid-state imaging device 61 is not photoelectrically converted in the photodiode PD and transmits through the photodiode PD as indicated in the arrows in FIGS. 6A to 6C. At this time, the amount of transmitting light is larger for a longer-wavelength light, and thus the amount of red light in FIG. 6A is the largest, the amount of green light in FIG. 6B is the second largest, and the amount of blue light in FIG. 6C is the smallest.

Then, when the CC bonding part is arranged below the photodiode PD, the transmitting light is reflected on the CC bonding part to be incident in the photodiode PD again. The light incident in the photodiode PD again can cause an increase in sensitivity of the pixels in which the light is incident, and the light can be incident in a different pixel from the pixel again depending on an incident angle and can cause color mixture. The increase in sensitivity of the pixel and the amount of caused color mixture in other pixel are more conspicuous at pixels in which a longer-wavelength light is incident. That is, in FIGS. 6A to 6C, they appear the most conspicuously in the red pixels, they appear the second most conspicuously in the green pixels, and the blue pixels are the least sensitive. In this way, as a variation in sensitivity or the amount of color mixture between pixels is larger, a reduction in image quality can be caused in an image output from the solid-state imaging device.

Exemplary Cross-Section Structure of Solid-State Imaging Device

An exemplary cross-section structure of a solid-state imaging device according to the present embodiment will be described with reference to FIG. 7. FIG. 7 illustrates the solid-state imaging device according to the present embodiment, or the first embodiment of the CMOS solid-state imaging device of backside irradiation type. The CMOS solid-state imaging device of backside irradiation type is a CMOS solid-state imaging device in which a light reception unit is arranged on top of the circuit unit and which has a higher sensitivity and lower noise than that of surface irradiation type. A solid-state imaging device 71 according to the first embodiment includes a laminate semiconductor chip in which a first semiconductor chip part 72 forming the pixel array 23 and the control circuit 24 thereon is adhered to a second semiconductor chip part 73 forming the logic circuits 25 thereon similarly to the solid-state imaging device 1a of FIG. 2A. The first semiconductor chip part 72 is adhered to the second semiconductor chip part 73 such that the multilayered wiring layers thereof described below face each other and the connection wirings thereof are directly bonded to each other.

The first semiconductor chip part 72 is such that a semiconductor well region 710 is formed in a first semiconductor substrate 74 including thinned silicon. A pixel array in which a plurality of pixels each configured of a photodiode PD as photoelectric conversion unit or photoelectric conversion region and a plurality of pixel transistors Tr1 are two-dimensionally arranged in line is formed in the semiconductor well region 710. Further, though not illustrated, a plurality of MOS transistors configuring the control circuit 24 are formed on the first semiconductor substrate 74. A multilayered wiring layer 701 in which a plurality of, or three metal-made wirings according to the present embodiment are arranged via an inter-layer insulative film 704 is formed on the surface of the first semiconductor substrate 74. Copper (Cu) wirings formed in the dual-damascene method are employed for the wirings by way of example. A light shield film is formed on the backside of the first semiconductor substrate 74 via an insulative film 78, and a color filter 76 and an on-chip lens 77 are formed on the effective pixel array via a planarization film 79.

In FIG. 7, the pixel transistors Tr1 are illustrated as representative pixel transistors. A corresponding pixel transistor Tr1 and the wiring, and vertically-adjacent wirings are connected via conductive vias 703 in the multilayered wiring layer 701 in the first semiconductor chip part 72. Further, copper (Cu)-made first electrode pads (or connection portions) 702 at the fourth wiring layer are formed to face a bonding face 709 with the second semiconductor chip part 73. The first electrode pads 702 are connected to a desired metal-made wiring at the third layer via the conductive vias 703 below the blue pixels. Further, first dummy pads 702d made at the same size and of the same material as the first electrode pads 702 are formed at the fourth wiring layer below the blue pixels where the first electrode pad 702 is not formed.

The logic circuits (not illustrated) configuring the peripheral circuits are formed in the regions of the respective semiconductor chip parts on a silicon-made second semiconductor substrate 75 in the second semiconductor chip part 73. The logic circuits are configured of a plurality of MOS transistors Tr2 including CMOS transistors. A multilayered wiring layer 705 in which a plurality of, or three metal-made wirings according to the present embodiment are arranged via an inter-layer insulative film 708 is formed on the surface of the second semiconductor substrate 75. Coper (Cu) wirings in the dual-damascene method are employed for the wirings by way of example.

In FIG. 7, the MOS transistors Tr2 are illustrated as representative MOS transistors in the logic circuits. The MOS transistors Tr2 and the wirings, and vertically-adjacent wirings are connected via conductive vias 707 in the multilayered wiring layer 705 in the second semiconductor chip part 73. Further, copper (Cu)-made second electrode pads (or connection portions) 706 are formed at the fourth wiring layer to face the bonding face 709 with the first semiconductor chip part 72. The second electrode pads 706 are connected to a desired metal-made wiring at the third layer via the conductive vias 707. Further, second dummy pads 706d made at the same size and of the same material as the second electrode pads 706 are formed at the fourth wiring layer below the blue pixels where the second electrode pad 706 is not formed.

The first semiconductor chip part 72 is electrically connected to the second semi-conductor chip part 73 via the CC bonding parts in which the first electrode pads 702 and the second electrode pads 706, which face the bonding face 709, are directly bonded such that the multilayered wiring layers 701 and 705 face each other. The inter-layer insulative film around the bonding parts is made in a combination of a Cu diffusion barrier insulative film for preventing (or alternatively, mitigating) Cu diffusion of the Cu wirings and an insulative film without Cu diffusion barrier property, for example. Direct bonding between the Cu connection wirings is performed by thermal diffusion bonding, for example. Inter-layer insulative films other than the connection wirings are bonded by plasma bonding or an adhesive, for example.

According to the present embodiment, the CC bonding parts as the connection parts for connecting the vertical signal lines provided in the pixel array arranged in the first semiconductor chip part 72 and the column signal processing circuits arranged in the second semiconductor chip part 73 are arranged only below the blue pixels in the color filter 76. Additionally, in a case where one column of pixels configuring the pixel array in the first semiconductor chip part 72 is provided with a plurality of vertical signal lines, the CC bonding parts as the connection parts of the vertical signal lines can be arranged below the blue pixels included in the column of pixels. Further, in a case where the pixel array is a Bayer pattern, the vertical signal lines arranged in a column of pixels not including a blue pixel are extended below the blue pixels arranged in its adjacent column and the CC bonding parts can be arranged below the blue pixels arranged in the adjacent column.

Exemplary Pixel Arrangement of Solid-State Imaging Device

An exemplary pixel arrangement of the solid-state imaging device according to the present embodiment will be described with reference to FIGS. 8A to 8C. FIG. 8A is a plan arrangement diagram illustrating the vertical signal lines in the solid-state imaging device according to the present embodiment similarly to FIG. 3A. FIG. 8B is a schematic configuration diagram illustrating an arrangement of the CC bonding parts in a region A8 in the pixel array of FIG. 8A. FIG. 8C is a partially-enlarged diagram illustrating wirings of the first semiconductor chip similarly to FIG. 3C. In FIG. 8C, the pixel 4 is connected to the first output line (VSL1), the pixel 3 is connected to the second output line (VSL2), the pixel 2 is connected to the third output line (VSL3), and the pixel 1 is connected to the fourth output line (VSL4).

As illustrated in FIG. 8B, a pixel array 81 in the solid-state imaging device 71 according to the present embodiment is arranged in a square shape in which one red pixel 82, two green pixels 83, 84, and one blue pixel 85 are arranged with the green pixels 83, 84 diagonally placed. In other words, the green pixels 84 and red pixels 82 are alternately arranged in one column and the blue pixels 85 and the green pixels 83 are alternately arranged in its adjacent column. CC bonding parts (or connection portions) 86 as dummy pads, or CC bonding pads 87 in which the first electrode pad 702 is directly bonded to the second electrode pad 706 are then arranged only below the blue pixels 85.

With the above configuration, the solid-state imaging device 71 according to the present embodiment can further restrict the amount of lights transmitting through the photodiodes PD, reflected on the surfaces of the CC bonding parts 86, 87, and incident again in the photodiodes thereby to reduce an increase in sensitivity in the pixels and color mixture into other pixel as compared with the configuration in which the CC bonding parts are arranged below all of the red pixels, the green pixels, and the blue pixels.

Further, according to the present embodiment, the CC bonding parts 86, 87 are arranged only below the blue pixels 85 at the center of the pixel array 81. Incidentally, a light may be incident in the photodiode PD from above a pixel, may not be photo-electrically converted in the photodiode PD, and may transmit even in a blue pixel 85. Thus, even in a case where a light transmits through the blue pixels 85, in order to prevent (or alternatively, reduce) a difference in sensitivity between the blue pixels 85 below which the CC bonding parts 87 in which the first electrode pad 702 is directly bonded to the second electrode pad 706 are arranged and the blue pixels 85 below which the CC bonding parts 87 are not arranged, the CC bonding parts 86 in which the first dummy pad 702d and the second dummy pad 706d are bonded are arranged below the blue pixels 85 below which the CC bonding parts 87 are not arranged. With the configuration, in addition to the above effect, it is possible to reduce a difference in sensitivity between same-color pixels due to the presence of the same-color pixels for which the first electrode pads 702 and the second electrode pads 706 are arranged and the same-color pixels for which they are not arranged.

Exemplary Method for Manufacturing Solid-State Imaging Device

An exemplary method for manufacturing the solid-state imaging device 71 according to the present embodiment will be described below.

At first, the semiconductor well region 710 is formed at the regions of the respective semiconductor chip parts in the silicon-made first semiconductor substrate 74, for example, and the photodiodes PD as photoelectric conversion units of the respective pixels are formed in the semiconductor well region 710. By way of example, a device isolation region can be first formed. Each photodiode PD is formed to extend in the depth direction of the semiconductor well region 710. The photodiodes PD are formed in the effective pixel array configuring the pixel array and the optical black region.

Further, a plurality of pixel transistors Tr1 configuring each pixel are formed on the surface of the semiconductor well region 710. The pixel transistors Tr1 can be configured of transfer transistor, reset transistor, amplification transistor, and selection transistor, for example. Here, as described above, the pixel transistors Tr1 are illustrated as a representative. Each pixel transistor Tr1 is formed to have a pair of source/drain regions and a gate electrode formed via a gate insulative film by way of example.

The wiring layer 701 with a plurality of, or three metal-made layers according to the present embodiment including the conductive vias 703 is formed on the surface of the first semiconductor substrate 74 via the inter-layer insulative film 704. The wiring layer 701 can be formed in the dual-damascene method. That is, connection holes and wiring trenches are formed in the inter-layer insulative film 704 by Via First at the same time, a Cu diffusion barrier metal film for preventing (or alternatively, reducing) Cu diffusion and a Cu seed film are formed, and then a Cu material layer is embedded in a plating method. The Cu diffusion barrier metal film may be Ta, TaN, Ti, TiN, W, WN, Ru, TiZrN, or an alloy film containing the same, for example. An excessive Cu material layer is then removed by the chemical mechanical polishing (CMP) method, and the Cu wirings integrated with the planarized conductive vias 703 are formed. Thereafter, a Cu diffusion barrier insulative film (not illustrated) is formed. The Cu diffusion barrier insulative film may employ an insulative film such as SiN, SiC, SiCN, or SiON. The steps are repeatedly performed to form the three-layer metal-made wiring layer 701.

Then, a first insulative film without Cu diffusion barrier property, a second insulative film without Cu diffusion barrier property, and a Cu diffusion barrier insulative film are sequentially formed. The first insulative film and the second insulative film are made by including a $SiO_2$ film, SiCOH film, or the like. Further, the Cu diffusion barrier insulative film may employ an insulative film such as SiN, SiC, SiCN, or SiON as described above. The Cu diffusion barrier insulative film, the first insulative film, and the second insulative film correspond to the inter-layer insulative film 704. Then, the top Cu diffusion barrier insulative film, the second insulative film, and the first insulative film are patterned by Via First using the lithography and etching techniques thereby to selectively form via holes. Thereafter, the second insulative film is patterned to selectively form openings. That is, the second insulative film is patterned to provide the openings 78 corresponding to the light shield parts 71 (except the openings 73) to be formed, the openings corresponding to the first electrode pads 702 to be formed and the first dummy pads 702*d*, and the via holes.

Then, as described above, the conductive vias 703 and the first electrode pads 702 which are connected to the wirings, and the first dummy pads 702*d* are formed to embed the Cu material in the openings and the via holes in the dual-damascene method. The first electrode pads 702 and the first dummy pads 702*d* are made by including the metal at the fourth layer. Thereby, the multilayered wiring layer 701 is formed by including the metal wirings, the first electrode pads 702, the first dummy pads 702*d*, the inter-layer insulative film 704, and the insulative film.

Further, an extremely-thin and uniform insulative film can be formed on top of the first electrode pads 702 and the first dummy pads 702*d*.

On the other hand, a semiconductor well region is formed at the regions of the respective semiconductor chip parts in the silicon-made second semiconductor substrate 75, for example. A plurality of MOS transistors Tr2 configuring the logic circuits are formed in the semiconductor well region. Here, as described above, the MOS transistors Tr2 are illustrated as a representative. A device isolation region can be first formed by way of example.

The wiring layer with a plurality of, or three metal-made layers according to the present embodiment including the conductive vias 707 is formed on the surface of the second semiconductor substrate 75 via the inter-layer insulative film 708. The wiring layer 705 can be formed in the dual-damascene method. That is, connection holes and wiring trenches are formed in the inter-layer insulative film 708 by Via First at the same time, a Cu diffusion barrier metal film for preventing (or alternatively, reducing) Cu diffusion and a Cu seed film are formed, and then a Cu material layer is embedded in a plating method. The Cu diffusion barrier metal film may be Ta, TaN, Ti, TiN, W, WN, Ru, TiZrN, or an alloy film containing the same, for example. An excessive Cu material layer is then removed by the chemical mechanical polishing (CMP) method to form a Cu wiring integrated with the planarized conductive vias 707. Thereafter, a Cu diffusion barrier insulative film (not illustrated) is formed. The Cu diffusion barrier insulative film can employ an insulative film such as SiN, SiC, SiCN, or SiON. The steps are repeatedly performed to form the three-layer metal-made wiring layer 705.

A first insulative film without Cu diffusion barrier property, a second insulative film without Cu diffusion barrier property, and a CU diffusion barrier insulative film are sequentially formed. The first insulative film and the second insulative film are made by including a $SiO_2$ film, SiCOH film, or the like. Further, the Cu diffusion barrier insulative film can employ an insulative film such as SiN, SiC, SiCN, or SiON as described above. The Cu diffusion barrier insulative film, the first insulative film, and the second insulative film correspond to the inter-layer insulative film 708. Then, the top Cu diffusion barrier insulative film, the second insulative film, and the first insulative film are patterned by Via First using the lithography and etching techniques thereby to selectively form via holes. Thereafter, the second insulative film is patterned to selectively form openings. The openings are formed to cover the openings of the first electrode pads 702 closer to the first semiconductor chip part 72. It is desirable that the openings are formed in a size to cover the openings of the first electrode pads 702 and to partially overlap on the first electrode pads 702 in order to prevent (or alternatively, reduce) light leakage due to misalignment when the first semiconductor substrate 74 is bonded to the second semiconductor substrate 75 later. That is, the films are patterned to have the openings corresponding to the first electrode pads 702 to be formed and the via holes.

Then, as described above, the conductive vias 707 connected to the wirings as well as the second electrode pads 706 and the second dummy pads 706*d* are formed to embed the Cu material in the openings and the via holes in the dual-damascene method. The second electrode pads 706 and the second dummy pads 706*d* are made by including the metal at the fourth layer. Thereby, the multilayered wiring layer 705 is formed by including the metal-made wirings, the second electrode pads 706, the second dummy pads 706*d*, the inter-layer insulative film 708, and the insulative film.

Further, an extremely-thin and uniform insulative film is formed on top of the second electrode pads 706 and the second dummy pads 706*d*.

Then, the first semiconductor substrate 74 is bonded to the second semiconductor substrate 75 such that the multilayered wiring layers of the first semiconductor substrate 74 and the second semiconductor substrate 75 face each other and the first electrode pads 702 and the second electrode pads 706 directly contact and are electrically connected to each other. That is, the first and second semiconductor substrate 74 and 75 are physically bonded and electrically connected to each other. At this time, the first electrode pads 702 and the second electrode pads 706 are directly bonded to each other at their overlapping parts. That is, the first electrode pads 702 and the second electrode pads 706 are subjected to thermal diffusion bonding in a thermal processing. The thermal processing temperature at this time can be set at about 100° C. to 500° C. Further, the surfaces of the insulative films as inter-layer insulative films are processed to be plasma-bonded. Additionally, the insulative films as inter-layer insulative films can be bonded by an adhesive.

In this way, an insulative film is first sandwiched in the bonding face 709 and is then heated to crystal-grow copper as conductive body so that the first electrode pads 702 and the second electrode pads 706 are coupled and electrically connected to each other around the bonding face 709. Thus, the first electrode pads 702 and the second electrode pads 706 are arranged closer to the bonding face 709 than the logic circuits and the wirings formed in the first semiconductor chip part 72 and the second semi-conductor chip part 73, respectively.

Then, the first semiconductor substrate 74 is ground, polished, and thinned from its backside in the CMP method or the like such that a required film thickness of the photodiodes PD remains.

Then, a light shield film including the photodiodes PD corresponding to the optical black region is formed on the thinned surface via the insulative film. Further, the color filter 66 and the on-chip lens 77 are formed on the photodiodes PD corresponding to the effective pixel array via the planarization film 79.

Then, the first semiconductor substrate 74 and the second semiconductor substrate 75 which are bonded to each other are separated into semiconductor chips thereby to obtain the desired solid-state imaging device 71 illustrated in FIG. 7.

A metal of the wiring at the same layer as the first electrode pads 702 and the second electrode pads 706 as well as the first electrode pads 702 and the first dummy pads 702d is desirably a material which is high in conductivity, high in light shielding property, and easy to bond. The material with the property can employ a single material such as Al, W, Ti, Ta, Mo, or Ru, or an alloy in addition to Cu.

A film thickness of the first electrode pad 702 and the second electrode pad 706 according to the present embodiment is desirably determined depending on a wavelength of a light of the second semiconductor chip 73 which emits the light. By way of example, the thickness of the first electrode pad 702 and the second electrode pad 706 can be set at about 50 nm to 800 nm.

In the method for manufacturing the solid-state imaging device 71 according to the present embodiment, the first electrode pads 702 and the second electrode pads 706 are made by including a metal as wiring layers, and thus the entire thickness of the bonded semiconductor chips can be smaller than in the typical technology, and the solid-state imaging device 71 can be thinned. Thereby, it is possible to provide the solid-state imaging device 71 with less dark currents and random noises without increasing the entire thickness of the semiconductor chips.

Further, in the method for manufacturing the solid-state imaging device 71 according to the present embodiment, the wirings, the connection wirings, the electrode pads, and the dummy pads can be formed at the same time, and thus a reduction in manufacture steps and a reduction in material cost can be achieved, thereby manufacturing the solid-state imaging device with less dark currents and random noises at low cost.

<4. Solid-State Imaging Device According to Second Embodiment>

A solid-state imaging device according to a second embodiment of the present technology will be described with reference to FIG. 9. The present embodiment is different from the first embodiment in that a pixel array has a two-pixel vertical-sharing structure.

As illustrated in FIG. 9, a pixel array 91 in the solid-state imaging device according to the present embodiment forms the two-pixel vertical-sharing structure in which a floating diffusion (FD) 92 is shared by two pixels arranged above and below each column. That is, as illustrated in FIG. 9, one FD 92 is shared by a green pixel 84 and a red pixel 82, and one FD 92 is shared by a blue pixel 85 and a green pixel 83. With the above configuration, the solid-state imaging device according to the present embodiment can obtain similar effects to the solid-state imaging device 71 according to the first embodiment.

<5. Solid-State Imaging Device According to Third Embodiment>

A solid-state imaging device according to a third embodiment of the present technology will be described with reference to FIG. 10. The present embodiment is different from the first and second embodiments in that a pixel array has a four-pixel sharing structure. Additionally, the pixel sharing structure of a pixel array according to an embodiment of the present technology is not limited to the two-pixel vertical-sharing structure and the four-pixel sharing structure, and may be other sharing structure.

As illustrated in FIG. 10, a pixel array 101 in the solid-state imaging device according to the present embodiment forms the four-pixel sharing structure of two rows by two columns in which a floating diffusion (FD) 102 is shared at the center of four pixels arranged in a square shape. That is, as illustrated in FIG. 10, a red pixel 82, green pixels 83, 84, and a blue pixel 85 arranged in a square shape share one FD 102. With the above configuration, the solid-state imaging device according to the present embodiment can obtain similar effects to the solid-state imaging device 71 according to the first embodiment.

<6. Solid-State Imaging Device According to Fourth Embodiment>

A solid-state imaging device according to a fourth embodiment of the present technology will be described with reference to FIG. 11. The present embodiment is different from the first embodiment in that some of CC bonding parts are formed also below the pixels other than the blue pixels.

As illustrated in FIG. 11, in a pixel array 111 in the solid-state imaging device according to the present embodiment, CC bonding parts (or connection portions) 112 in which the first electrode pad 702 is bonded to the second electrode pad 706 are arranged below the blue pixels 85, but some of them extends below the green pixels 84. Additionally, the CC bonding parts 112 may extend below the green pixels 83 not limited to the above. With the above configuration, the solid-state imaging device according to the present embodiment can obtain similar effects to the solid-state imaging device 71 according to the first embodiment. As shown, in the plan view, the CC bonding part 112 does not overlap the red and green pixels 82 and 83. Further, a first part of the CC bonding part 112 overlaps the pixel 85, and a second part of the CC bonding part 112 overlaps the pixel 84. Here, the first part is larger than the second part in the plan view.

<7. Solid-State Imaging Device According to Fifth Embodiment>

A solid-state imaging device according to a fifth embodiment of the present technology will be described with reference to FIG. 12. The present embodiment is different from the first embodiment in that a plurality of CC bonding parts are arranged blow a blue pixel.

As illustrated in FIG. 12, in a pixel array 121 in the solid-state imaging device according to the present embodiment, four CC bonding parts (or connection portions) 122 in which the first electrode pad 702 is bonded to the second electrode pad 706 are arranged in two rows by two columns below a blue pixel 85. Additionally, the number of CC bonding parts 112 is not limited to four, and may be two or more.

With the above configuration, the solid-state imaging device according to the present embodiment can obtain similar effects to the solid-state imaging device 71 according to the first embodiment. Further, the solid-state imaging device according to the present embodiment has more CC bonding parts arranged below one blue pixel 85 than that according to the first embodiment, and thus more vertical signal lines can be arranged at a certain area of the pixel array 121 than in the first embodiment. Thereby, the solid-state imaging device according to the present embodiment can further reduce the parasitic capacitance of the vertical signal lines and further increase the number of divisions of the vertical signal lines thereby to operate faster than the solid-state imaging device 71 according to the first embodiment.

<8. Solid-State Imaging Device According to Sixth Embodiment>

Figure 13A:
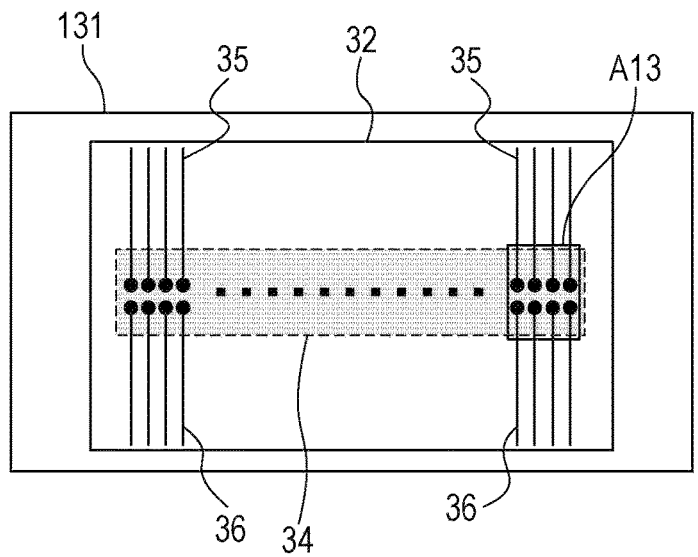
FIG. 13A is a plan arrangement diagram illustrating vertical signal lines of a solid-state imaging device according to a sixth embodiment.
Figure 13B:
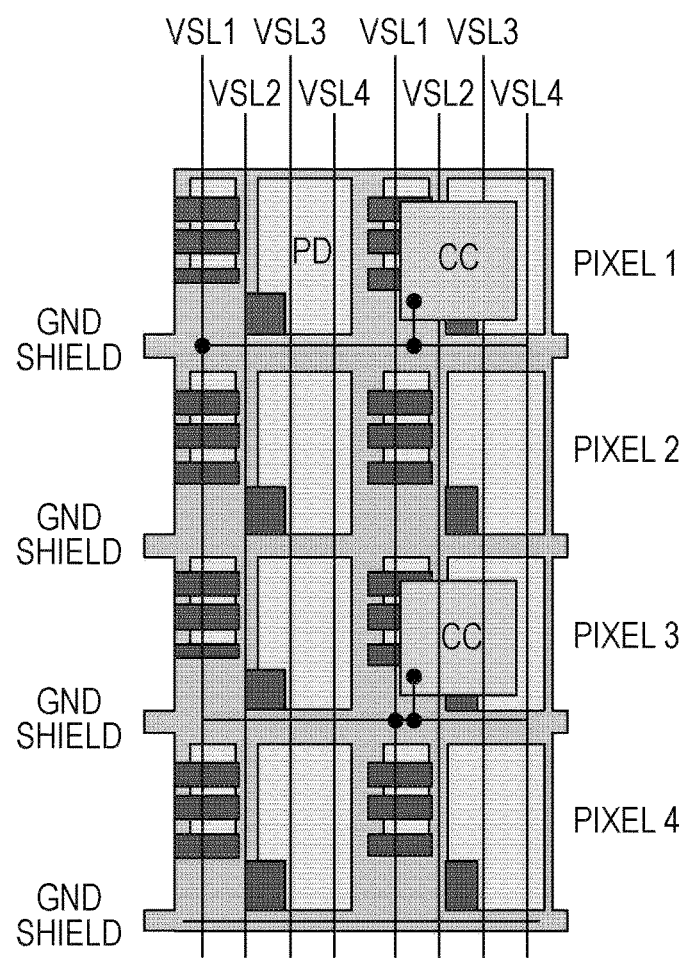
FIG. 13B is a partially-enlarged diagram illustrating wirings of an upper chip of the semiconductor device.
Figure 14A:
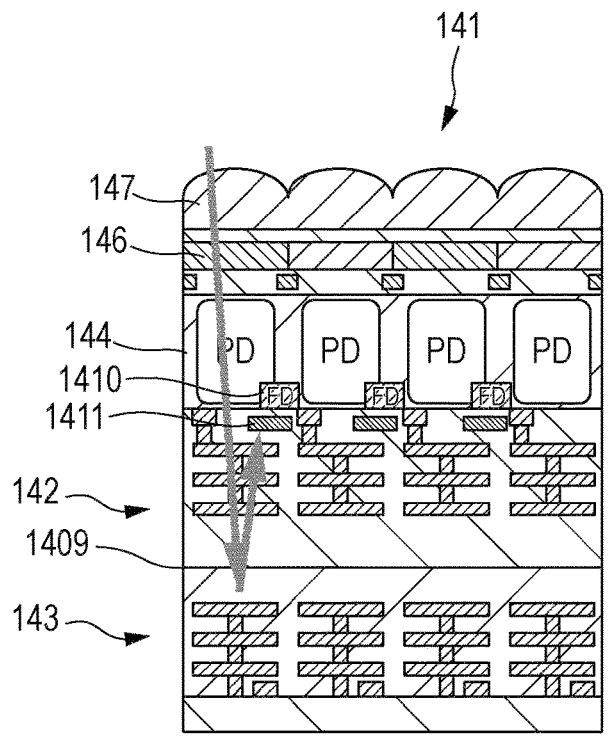
FIG. 14A is a cross-section view illustrating an incident light from a red pixel of the solid-state imaging device according to the sixth embodiment.

A solid-state imaging device according to a sixth embodiment of the present technology will be described with reference to FIGS. 13A and 13B and FIGS. 14A to 14C. The present embodiment is different from the first embodiment in that a wiring provided in a pixel is arranged on an FD and a light shield structure for giving a low voltage to the FD is provided. FIG. 13A is a plan arrangement diagram illustrating a first semiconductor chip part 131 in the solid-state imaging device according to the present embodiment similarly to FIG. 3A. FIG. 13B is a partially-enlarged diagram of a region A13 of FIG. 13A illustrating CC bonding regions in the solid-state imaging device according to the present embodiment similarly to FIG. 8A. FIG. 14A is a cross-section view illustrating an incident light from a red pixel in the solid-state imaging device according to the present embodiment, FIG. 14B is a cross-section view illustrating an incident light from a green pixel, and FIG. 14C is a cross-section view illustrating an incident light from a blue pixel.

As illustrated in FIG. 14A, the solid-state imaging device 141 according to the present embodiment includes a laminate semiconductor chip in which a first semiconductor chip part 142 forming a pixel array and a control circuit thereon is adhered to a second semiconductor chip part 143 forming logic circuits thereon.

The first semiconductor chip part 142 is such that the pixel array including photodiodes PD as photoelectric conversion units and a plurality of pixel transistors is formed on a silicon-made first semiconductor substrate 144. Further, a color filter 146 and an on-chip lens 147 are formed on the pixel array. The second semiconductor chip part 143 is such that the logic circuits configuring the peripheral circuits are formed in the regions of the respective semiconductor chip parts on a silicon-made second semi-conductor substrate though not illustrated.

Figure 14B:
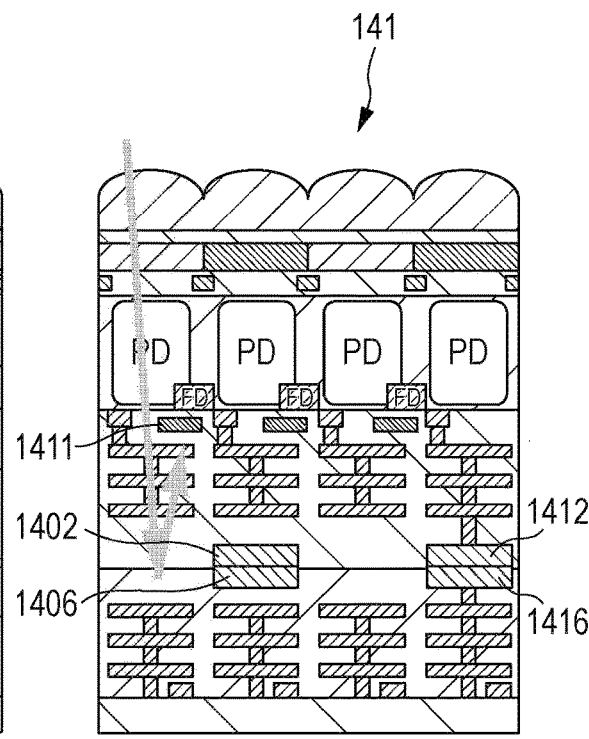
FIG. 14B is a cross-section view illustrating an incident light from a green pixel.
Figure 14C:
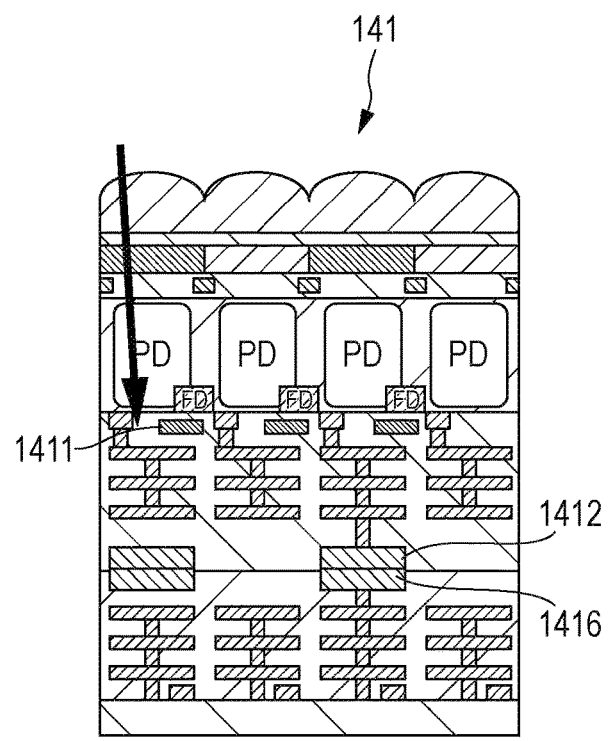
FIG. 14C is a cross-section view illustrating an incident light from a blue pixel.

As illustrated in FIG. 14B and FIG. 14C, metal-made first electrode pads 1412 are formed on the first semiconductor chip part 142 to face a bonding face 1409 with the second semiconductor chip part 143. Metal-made second semiconductor pads 1416 are formed on the second semiconductor chip part 143 to face the bonding face 1409 with the first semiconductor chip part 142. Then, the first electrode pads 1412 and the second electrode pads 1416 which face the bonding face 1409 are directly bonded to each other, and thus the first semiconductor chip part 142 is electrically connected to the second semiconductor chip part 143 such that the multilayered wiring layers thereof face each other. Further, first dummy pads (or connection portions) 1402 and second dummy pads (or connection portions) 1406 bonded on the bonding face 1409 are formed in the first semiconductor chip part 142 and the second semiconductor chip part 143, respectively.

The left end of the color filter 146 in FIG. 14A indicates a red pixel, red pixels and green pixels are alternately arranged from the left end, and a green pixel is arranged at the right end. Similarly, the left end of the color filter 146 in FIG. 14B indicates a green pixel, green pixels and blue pixels are alternately arranged from the left end, and a blue pixel is arranged at the right end. Further, the left of the color filter 146 in FIG. 14C indicates a blue pixel, blue pixels and green pixels are alternately arranged from the left end, and a green pixel is arranged at the right end.

The Cu—Cu electrode bonding parts (CC bonding parts) between the first electrode pads 1412 and the second electrode pads 1416, or the CC bonding parts between the first dummy pads 1402 and the second dummy pads 1406 are arranged only below the blue pixels in the solid-state imaging device 141. Further, the solid-state imaging device 141 includes the FDs 1410 each shared by two adjacent pixels in the pixel array, and light shield wirings 1411 below the FDs 1410. Note that the wirings of the FDs 1410 are not limited to being shared by two pixels, and the arrangement may be in a single pixel structure in which one pixel includes an FD 1410.

IF the CC bonding parts are arranged only below the blue pixels and the CC bonding parts are not arranged below the green pixels and the red pixels as in the solid-state imaging device 141 according to the present embodiment, the blue pixel is larger in area of the wiring arranged in the pixel than the green pixel and the red pixel. Further, the wiring arranged in a pixel forms parasitic capacitance parasitic to an FD 1410 in association with the FD 1410 formed in the pixel on the first semiconductor substrate 144. However, if the area of the wiring arranged in a blue pixel is larger than the area of the wiring arranged in a green pixel and a red pixel, the FD capacitance including the parasitic capacitance in the blue pixel can be larger than in the green pixel and the red pixel. Thereby, when a certain signal charge caused in the photodiode PD provided in a pixel is subjected to charge-voltage conversion in the FD 1410 to obtain an output voltage, the output voltage of the blue pixel may not match with those of the green pixel and the red pixel.

Thus, the solid-state imaging device 141 according to the present embodiment arranges the closest wiring layer to the FD 1410 among the wirings provided in a pixel on the FD 1410, and includes a light shield wiring 1411 for giving a low voltage to the FD 1410 in order to make each parasitic capacitance of FD 1410 equal among the blue pixel which is larger in area of the wiring provided in the pixel due to the arranged CC bonding parts, the green pixel and the red pixel in which the CC bonding parts are not arranged.

With the above configuration, the solid-state imaging device according to the present embodiment can obtain similar effects to the solid-state imaging device 71 according to the first embodiment. Further, the light shield structure is provided, and thus the solid-state imaging device 141 is such that a wiring formed farther from the FD 1410 than the light shield wiring 1411 does not form the parasitic capacitance relative to the FD 1410. Thereby, the CC bonding parts are arranged below the blue pixels and the CC bonding parts are not arranged below the green pixels and the red pixels, and thus even if the area of the wiring of the blue pixel is different from that of the green pixel and the red pixel, the parasitic capacitance is not caused between the wiring and the FD 1410 and the capacitance of the FD 1410 can be kept constant.

<9. Solid-State Imaging Device According to Seventh Embodiment>

Figure 15A:
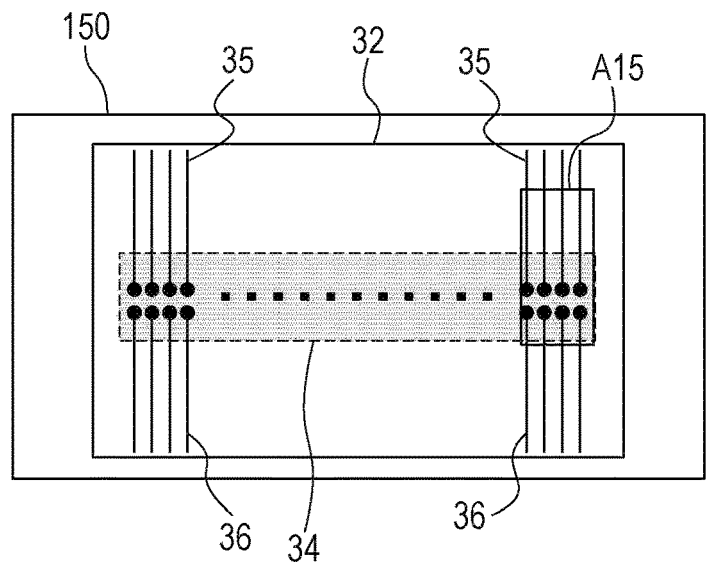
FIG. 15A is a plan arrangement diagram illustrating vertical signal lines of a solid-state imaging device according to a seventh embodiment.

A solid-state imaging device according to a seventh embodiment of the present technology will be described with reference to FIGS. 15A and 15B. The present embodiment is different from the first embodiment in that CC bonding parts are arranged below all of blue pixels, green pixels, and red pixels at the center of a pixel array. FIG. 15A is a plan arrangement diagram illustrating a first semiconductor chip part 150 in the solid-state imaging device according to the present embodiment similarly to FIG. 3A, and FIG. 15B is a schematic configuration diagram illustrating an arrangement of a pixel array 151 in a region A15 of the first semiconductor chip part 150 of FIG. 15A.

Figure 15B:
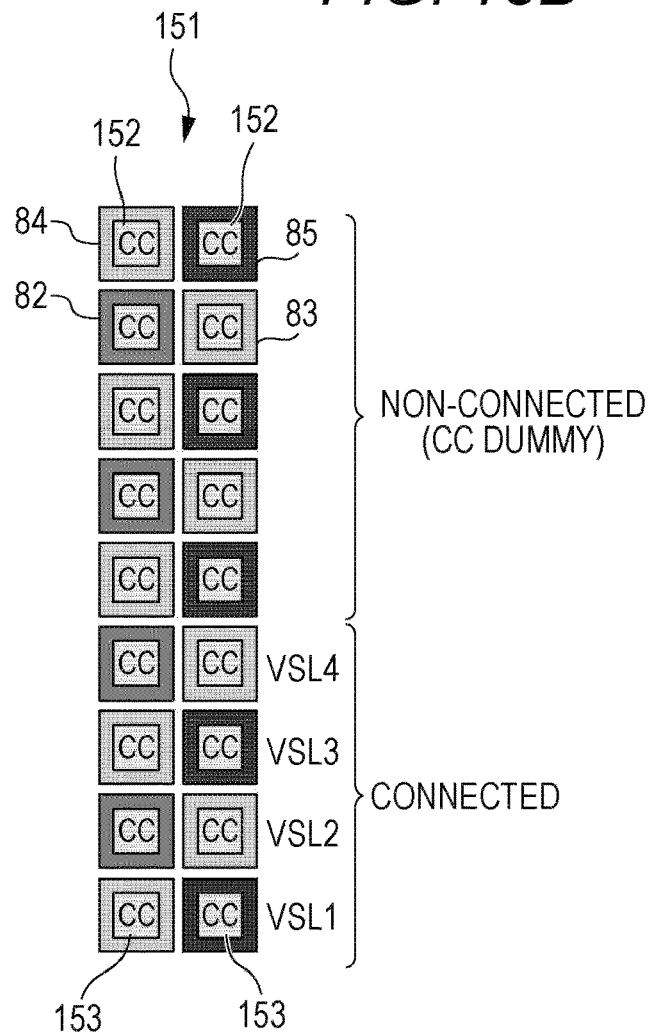
FIG. 15B is a schematic configuration diagram illustrating an arrangement of electrode pads.

As illustrated in FIG. 15A and FIG. 15B, the solid-state imaging device according to the present embodiment is such that the CC bonding parts(or connection portions) 153 as connection parts for connecting the vertical signal lines provided in the pixel array 151 arranged in the first semiconductor chip part 150 and the column signal processing circuits arranged in the second semiconductor chip part are arranged blow the blue pixels, the green pixels, and the red pixels at the center of the pixel array 151. Further, the solid-state imaging device according to the present embodiment is such that the dummy patterns (or connection portions) 152 made at the same size and of the same material as the CC bonding parts are arranged below the pixels below which the CC bonding parts are not arranged in the pixel array 151.

With the above configuration, the solid-state imaging device according to the present embodiment can correct color mixture into other pixel, which is caused by the fact that a light transmitting through a photodiode PD is reflected on the surface of a CC bonding part and is incident in the photodiode PD again, by a signal processing, thereby reducing a difference in sensitivity between same-color pixels.

Further, the solid-state imaging device according to the present embodiment may further include a correction unit configured to correct the output of a pixel in which color mixture is caused to the output not including color mixture by use of a signal processing circuit provided in the solid-state imaging device. For example, a relationship between the output of a pixel and the amount of light mixed into an adjacent pixel when the light is incident in the pixel is previously found per amount of incident light, and the output of each pixel obtained by imaging may be corrected by use of the relationship during actual use. The correction unit is provided so that the solid-state imaging device according to the present embodiment can prevent (or alternatively, reduce) color mixture into an adjacent pixel from appearing on an image output from the solid-state imaging device.

<10. Solid-State Imaging Device According to Eighth Embodiment>

A solid-state imaging device according to an eighth embodiment of the present technology will be described with reference to FIG. 16. The present embodiment is different from the first embodiment in that CC bonding parts are arranged only below the green pixels at the center of a pixel array.

As illustrated in FIG. 16, a pixel array 161 in the solid-state imaging device according to the present embodiment is such that CC bonding parts (or connection portions) 162 as dummy pads or CC bonding parts (or connection portions) 163 as connection pads are arranged only below the green pixels 83 and 84.

With the above configuration, the solid-state imaging device according to the present embodiment can further reduce color mixture into an adjacent pixel from a red pixel 82 than a case where the CC bonding parts 162 or the CC bonding parts 163 are arranged below all the pixels. Further, the solid-state imaging device according to the present embodiment can further restrict a deterioration in flatness of the surfaces of the CC bonding parts such as shoulder dropout of the CC bonding parts due to a large area of the CC bonding parts in the entire wafer when the CC bonding parts are formed on the respective surfaces of the first semiconductor chip part and the second semiconductor chip part in a polishing method in a wafer step of manufacturing the solid-state imaging device than a case where the CC bonding parts 162 or the CC bonding parts 163 are arranged only below the blue pixels 85.

<11. Solid-State Imaging Device According to Ninth Embodiment>

A solid-state imaging device according to a ninth embodiment of the present technology will be described below with reference to FIG. 17 and FIG. 18. The present embodiment is different from the first embodiment in that CC bonding parts are arranged only below the red pixels at the center of a pixel array.

As illustrated in FIG. 17, CC bonding parts (or connection portions) 172 as dummy pads or CC bonding parts (or connection portions) 173 as connection pads are arranged only below the red pixels 82 in a pixel array 171 in the solid-state imaging device according to the present embodiment.

As illustrated in FIG. 18, the solid-state imaging device 181 according to the present embodiment includes a laminate semiconductor chip in which a first semiconductor chip part 182 forming the pixel array 171 and a control circuit thereon is adhered to a second semiconductor chip part 183 forming logic circuits thereon.

The first semiconductor chip part 182 is such that the pixel array 171 configured of photodiodes PD as photoelectric conversion units and a plurality of pixel transistors is formed on a silicon-made first semiconductor substrate 184. Further, a color filter 186 and an on-chip lens 187 are formed on the pixel array 171. The second semiconductor chip part 183 is such that the logic circuits configuring the peripheral circuits are formed in the regions of the respective semiconductor chip parts on a silicon-made second semiconductor substrate though not illustrated.

As illustrated in FIG. 18, metal-made first electrode pads 1812 are formed on the first semiconductor chip part 182 to face a bonding face 1809 with the second semi-conductor chip part 183. Meta-made second electrode pads 1816 are formed on the second semiconductor chip part 183 to face the bonding face 1809 with the first semi-conductor chip part 182. Then, the first electrode pads 1812 and the second electrode pads 1816 which face the bonding face 1809 are directly bonded to each other, and thus the first semiconductor chip part 182 is electrically connected to the second semi-conductor chip part 183 such that the multilayered wiring layers thereof face each other. Further, first dummy pads (or connection portions) 1802 and second dummy pads (or connection portions) 1806, which are bonded at the bonding face 1809, are formed on the first semiconductor chip part 182 and the second semiconductor chip part 183, respectively.

The left end of the color filter 186 in FIG. 18 indicates a red pixel, red pixels and green pixels are alternately arranged from the left end, and a green pixel is arranged at the right end. Further, the solid-state imaging device 181 is such that the CC bonding parts 172 between the first dummy pads 1802 and the second dummy pads 1806, or the Cu—Cu electrode bonding parts (CC bonding parts) 173 between the first electrode pads 1812 and the second electrode pads 1816 are arranged only below the red pixels 82.

With the above configuration, the solid-state imaging device according to the present embodiment can enhance a sensitivity of pixels when a reflected incident light is incident in the pixel again. Therefore, in a case where an incident light is almost vertical and its reflected light is incident in the pixel again or by forming a structure in which color mixture in the wiring layers is prevented (or alternatively, reduced), the solid-state imaging device according to the present embodiment can enhance a sensitivity of pixels by reflecting the light on the pixel.

<12. Solid-State Imaging Device According to Tenth Embodiment>

Figure 19A:
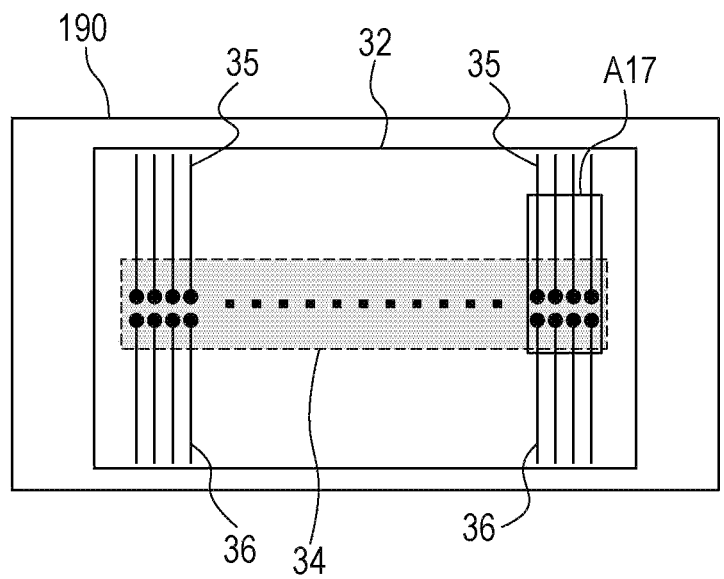
FIG. 19A is a plan arrangement diagram illustrating vertical signal lines of a solid-state imaging device according to a tenth embodiment.
Figure 19B:
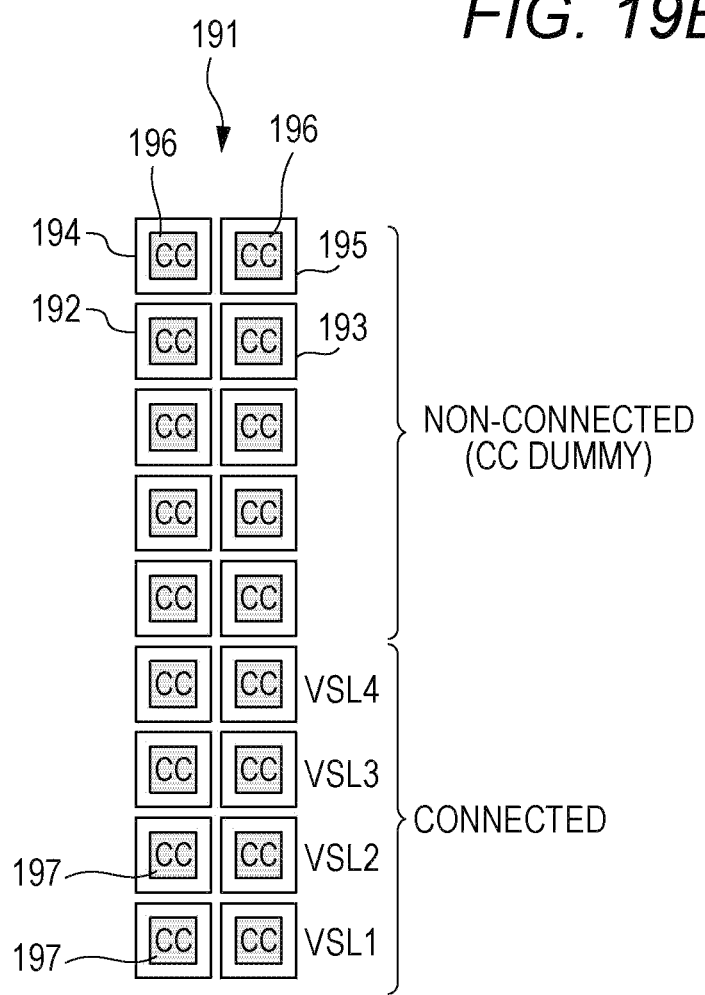
FIG. 19B is a schematic configuration diagram illustrating an arrangement of electrode pads.

A solid-state imaging device according to a tenth embodiment of the present technology will be described with reference to FIGS. 19A and 19B. The present embodiment is different from the first embodiment in that the solid-state imaging device does not include a color filter and CC bonding parts are provided below all the pixels. FIG. 19A is a plan arrangement diagram illustrating a first semiconductor chip part 190 in the solid-state imaging device according to the present embodiment similarly to FIG. 3A. FIG. 19B is a schematic configuration diagram illustrating an arrangement of CC bonding parts in a region A17 in a pixel array 191 of FIG. 19A similarly to FIG. 8B.

As illustrated in FIG. 19B, pixels 192 to 195, none of which have a color filter, are arranged in the pixel array 191 in the solid-state imaging device according to the present embodiment. Further, CC bonding parts (or connection portions) 196 as dummy pads or CC bonding parts (or connection portions) 197 as connection pads are arranged below all the pixels.

The solid-state imaging device according to the present embodiment does not include a color filter, and thus the amount of reflected light relative to an incident light is constant and each color can be corrected. Additionally, the output of each pixel varies even if a color filter is not provided, and thus each color is corrected.

<13. Solid-State Imaging Device According to Eleventh Embodiment>

A solid-state imaging device according to an eleventh embodiment of the present technology will be described with reference to FIG. 20. The present embodiment is different from the tenth embodiment in that CC bonding parts are provided below the borders between pixels.

As illustrated in FIG. 20, CC bonding parts (or connection portions) 202 as dummy pads or CC bonding parts 203 as connection pads are arranged below the center of the four pixels 192 to 195 arranged in a square shape in a pixel array 201 in the solid-state imaging device according to the present embodiment by way of example. With the above configuration, the solid-state imaging device according to the present embodiment can obtain similar effects to the solid-state imaging device according to the tenth embodiment.

<14. Solid-State Imaging Device According to Twelfth Embodiment>

A solid-state imaging device according to a twelfth embodiment of the present technology will be described with reference to FIG. 21. The present embodiment is different from the eleventh embodiment in that FDs are arranged above CC bonding parts.

As illustrated in FIG. 21, CC bonding parts (or connection portions) 212 as dummy pads or connection pads are arranged below the center of the four pixels 192 to 195 arranged in a square shape in a pixel array 211 in the solid-state imaging device according to the present embodiment by way of example. Then, FDs 213 are arranged above the CC bonding parts 212. In this way, the solid-state imaging device according to the present embodiment does not include a color filter, and thus the amount of reflected light relative to an incident light is constant and the CC bonding parts 212 may be arranged on the borders between the pixels 192 to 195 with less transmitting light. With the above configuration, the solid-state imaging device according to the present embodiment can obtain similar effects to the solid-state imaging device according to the tenth embodiment.

<15. Solid-State Imaging Device According To Thirteenth Embodiment>

A solid-state imaging device according to a thirteenth embodiment of the present technology will be described with reference to FIG. 22. The present embodiment is different from the first embodiment in that CC bonding parts are arranged below all the pixels in a pixel array and the surface area of the CC bonding parts relative to the bonding face between the semiconductor chips is different per color of pixels.

As illustrated in FIG. 22, CC bonding parts (or connection portions) 226 to 229 are arranged below all the pixels 222 to 225 in a pixel array 221 in the solid-state imaging device according to the present embodiment. Here, the surface area of a CC bonding part relative to the bonding face between the semiconductor chips is the smallest for the CC bonding parts arranged below the pixels irradiated with an incident light with the longest wavelength, and is larger as the wavelength of an incident light is shorter. That is, the surface area of a CC bonding part is the smallest for the CC bonding parts 226 arranged below the pixels 222 without a color filter, and is larger for the CC bonding parts 227 arranged below the red pixels 223 of an incident light with a long wavelength and the CC bonding parts 228 arranged below the green pixels 224 of an incident light with a shorter wavelength than red in this order. Then, the surface area of the CC bonding part 229 arranged below the blue pixel 225 irradiated with an incident light with the shortest wavelength is the largest. In other words, in the plan view, the CC bonding part 229 overlaps an area of the pixel 225 that is larger than an area of pixels 222/223/224 overlapped by CC bonding parts 226/224/228.

The solid-state imaging device according to the present embodiment does not use the pixels 222 to 224 with small areas of the CC bonding parts as leads of the signal lines and uses only the CC bonding parts 229 of the blue pixels 225 with the least optical effect as connection pads. Further, the vertically-offset CC bonding parts 229 of the blue pixels 225 are used for columns without a blue pixel 225. With the above configuration, the solid-state imaging device according to the present embodiment can obtain similar effects to the solid-state imaging device 71 according to the first embodiment. Further, the solid-state imaging device according to the present embodiment can reduce the resistance of the signal lines by maximizing (or alternatively, increasing) the CC bonding parts used to connect the signal lines. Further, the solid-state imaging device according to the present embodiment can adjust the area density of the CC bonding parts by arranging the CC bonding parts also below the pixels other than the blue pixels 225, thereby easily adjusting flatness of the CC bonding face.

<16. Solid-State Imaging Device According to Fourteenth Embodiment>

A solid-state imaging device according to a fourteenth embodiment of the present technology will be described with reference to FIG. 23 and FIG. 24. The present embodiment is different from the first embodiment in that CC bonding parts are arranged below all the pixels in a pixel array and the number of CC bonding parts arranged per color of pixels is different.

As illustrated in FIG. 23, CC bonding parts 232 to 235 are arranged below all the pixels 222 to 225 in a pixel array 231 in the solid-state imaging device according to the present embodiment. Here, the number of CC bonding parts arranged below the pixels irradiated with an incident light with the longest wavelength is the smallest, and is larger as an incident light has a longer wavelength. That is, as for the number of CC bonding parts, by way of example, a minimum number of four CC bonding parts 232 are arranged at the four corners of a pixel 222 without a color filter, a minimum number of four CC bonding parts 233 are arranged at the centers of the respective sides of a red pixel 223 for an incident light with a long wavelength, and a larger number of eight CC bonding parts 234 are arranged along the respective sides of a green pixel 224 for an incident light with a shorter wavelength than red. Then, a maximum (or desired) number of nine CC bonding parts 235 are arranged in three rows by three columns below a blue pixel 225 irradiated with an incident light with the shortest wavelength. Additionally, the numbers of CC bonding parts are not limited to those according to the present embodiment. Further, the pixels 223 to 235 in the pixel array 231 form a four-pixel sharing structure in two rows by two columns in which an FD arranged at the center of the pixels is shared.

Figure 24A:
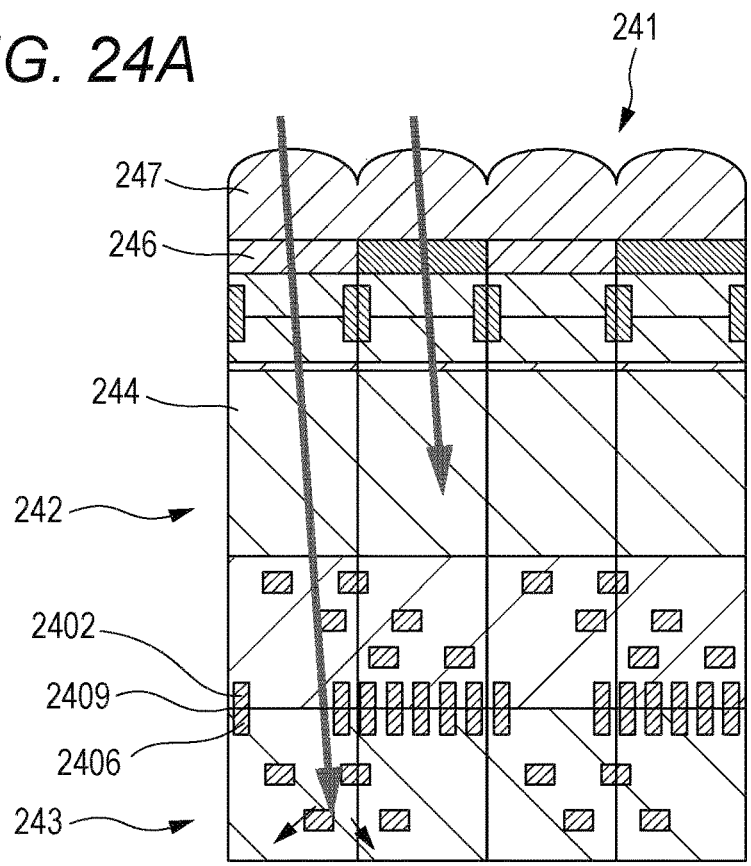
FIG 24 is a schematic cross-section view illustrating cross-section structures of the solid-state imaging device according to the fourteenth embodiment.

As illustrated in FIG. 24A, the solid-state imaging device 241 according to the present embodiment includes a laminate semiconductor chip in which a first semiconductor chip part 242 forming the pixel array 231 and a control circuit thereon is adhered to a second semiconductor chip part 243 forming logic circuits thereon.

The first semiconductor chip part 242 is such that the pixel array 231 configured of photodiodes PD as photoelectric conversion units and a plurality of pixel transistors is formed on a silicon-made first semiconductor substrate 244. Further, a color filter 246 and an on-chip lens 247 are formed on the pixel array 231. The second semiconductor chip part 243 is such that the logic circuits configuring the peripheral circuits are formed in the regions of the respective semiconductor chip parts on a silicon-made second semiconductor substrate though not illustrated.

As illustrated in FIG. 24A, metal-made first electrode pads (or connection portions) 2402 are formed on the first semiconductor chip part 242 to face a bonding face 2409 with the second semiconductor chip part 243. Metal-made second electrode pads (or connection portions) 2406 are formed on the second semiconductor chip part 243 to face the bonding face 2409 with the first semiconductor chip part 242. Then, the first electrode pads 2402 and the second electrode pads 2406 which face the bonding face 2409 are directly bonded to each other, and thus the first semiconductor chip part 242 is electrically connected to the second semiconductor chip part 243 such that the multilayered wiring layers thereof face each other. Further, the multilayered wiring layers 2401 and 2405, which face each other at the bonding face 2409, are formed in the first semiconductor chip part 242 and the second semiconductor chip part 243, respectively.

The left end of the color filter 246 in FIG. 24A indicates a pixel 222 without a color filter, the pixels 222 and the blue pixels 225 are alternately arranged from the left end, and a blue pixel 225 is arranged at the right end. Similarly, the left end of the color filter 246 in FIG. 24B indicates a red pixel 223, the red pixels 223 and the green pixels 224 are alternately arranged from the left end, and a green pixel 224 is arranged at the right end.

Figure 24B:
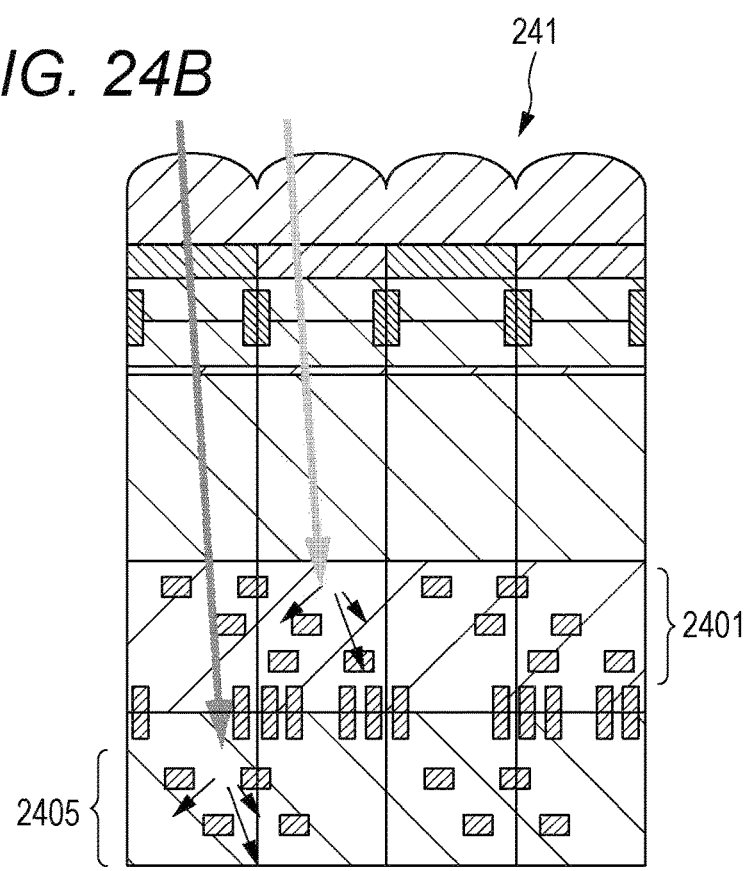

As illustrated in FIG. 23, FIG. 24A, and FIG. 24B, the number of CC bonding parts 232 in a pixel 222 through which an incident light most transmits is reduced and the CC bonding parts 232 are arranged only at the four corners through which a light is the least likely to transmit so that the solid-state imaging device according to the present embodiment can further adjust the effects due to reflection or color mixture with the above configuration. Similarly, the number of CC bonding parts is changed per color thereby to adjust an amount of reflection or color mixture. Further, the CC bonding parts are arranged also at the pixels other than the pixels 222 to adjust the area density of the CC bonding parts, and thus the present technology can enhance a degree of freedom of flatness of the CC bonding face like a case where the size of the CC bonding parts according to the thirteenth embodiment is changed.

<17. Electronic Device According to Fifteenth Embodiment>

A solid-state imaging device according to a fifteenth embodiment of the present technology will be described with reference to FIG. 25. FIG. 25 is a diagram illustrating an electronic device according to an embodiment of the present technology. The solid-state imaging device according to an embodiment of the present technology is applicable to electronic devices such as camera systems including digital camera and video camera, cell phones with an imaging function, and other devices with an imaging function.

FIG. 25 illustrates how the fifteenth embodiment is applied to a camera as an exemplary electronic device according to an embodiment of the present technology. The camera according to the present embodiment assumes a video camera capable of shooting still images or moving images. The camera 301 according to the present embodiment includes a solid-state imaging device 302, an optical system 303 configured to guide an incident light to a light reception sensor unit of the solid-state imaging device 302, and a shutter device 304. The camera 301 further includes a drive circuit 305 configured to drive the solid-state imaging device 302 and a signal processing circuit 306 configured to process an output signal of the solid-state imaging device 302.

Any of the solid-state imaging devices according to the above embodiments is applied to the solid-state imaging device 302. The optical system (optical lens) 303 forms an image of an image light (incident light) from an object on an imaging area of the solid-state imaging device 302. Thereby, the signal charges are accumulated in the solid-state imaging device 302 for a certain period. The optical system 303 may be an optical lens system configured of a plurality of optical lenses. The shutter device 304 controls a light irradiation period and a light shielding period for the solid-state imaging device 302. The drive circuit 305 supplies drive signals for controlling the transfer operation of the solid-state imaging device 302 and the shutter operation of the shutter device 304. The signal transfer of the solid-state imaging device 302 is performed in response to the drive signal (timing signal) supplied from the drive circuit 305. The signal processing circuit 306 performs various signal processing. A signal-processed video signal is stored in a storage medium such as memory, or is output to a monitor.

The electronic device according to the sixteenth embodiment includes the solid-state imaging device 302 of backside irradiation type according to an embodiment of the present technology, and thus a light hot-carrier emitted from a MOS transistor of a logic circuit is not incident in a pixel array thereby to restrict dark currents or random noises. Therefore, it is possible to provide the electronic device of high image quality. For example, it is possible to provide cameras with enhanced image quality and the like.

Note that embodiments of the present technology are not limited to the above embodiments, and can be variously changed without departing from the scope of the present technology. For example, a form in a combination of all or some of the above embodiments can be employed.

Further, the present technology can employ the following configurations.

(1) A solid-state imaging device including:
a first semiconductor chip which is formed by laminating a color filter, a pixel array, a first wiring layer, and first electrode pads; and
a second semiconductor chip which is bonded to the first semiconductor chip and is formed by laminating second electrode pads, a second wiring layer, and a logic circuit,
in which the first electrode pads are electrically connected to the second electrode pads at a bonding part between the first semiconductor chip and the second semi-conductor chip below the pixel array, and
the first electrode pads and the second electrode pads are arranged below pixels irradiated with an incident light with the shortest wavelength among the incident lights transmitting through the color filter.

(2) The solid-state imaging device according to (1),
in which at least some of the first electrode pads and the second electrode pads are arranged below the pixel array.

(3) The solid-state imaging device according to (1),
in which the first electrode pads and the second electrode pads are arranged only below pixels at the center of the pixel array.

(4) The solid-state imaging device according to (1),
in which dummy pads are further formed at the bonding part, and
the first electrode pads and the second electrode pads, or the dummy pads are arranged below pixels through which at least the incident light with the shortest wavelength transmits.

(5) The solid-state imaging device according to (1),
in which the first electrode pads or the second electrode pads are arranged below one pixel in the pixel array.

(6) The solid-state imaging device according to (1),
further including: a floating diffusion provided in one pixel in the pixel array, and in which a light shield is formed between the floating diffusion and the first electrode pads or the second electrode pads.

(7) The solid-state imaging device according to (1),
in which the pixel array forms a multi-pixel sharing structure.

(8) The solid-state imaging device according to (7),
further including: floating diffusions shared by the pixels;
in which a light shield is formed between the floating diffusions and the first electrode pads or the second electrode pads.

(9) The solid-state imaging device according to (1),
in which the pixels irradiated with the incident light with the shortest wavelength are blue pixels.

(10) The solid-state imaging device according to (1),
in which the first electrode pads and the second electrode pads are arranged below each pixel at the center of the pixel array, and
dummy pads are arranged below the pixels below which the electrode pads are not arranged in the pixel array.

(11) The solid-state imaging device according to (10),
in which the dummy pads are of the same size and the same material as the electrode pads.

(12) The solid-state imaging device according to (1),
in which the first electrode pads and the second electrode pads are arranged below all the pixels in the pixel array and a surface area thereof relative to the bonding part is different per color of pixels.

(13) The solid-state imaging device according to (12),
in which the first electrode pads and the second electrode pads arranged below the pixels irradiated with the incident light with the shortest wavelength have the largest surface area relative to the bonding part.

(14) The solid-state imaging device according to (1),
in which the first electrode pads and the second electrode pads are arranged below all the pixels in the pixel array, and different numbers of the first electrode pads and the second electrode pads are arranged per color of pixels.

(15) The solid-state imaging device according to (14),
in which the numbers of the first electrode pads and the second electrode pads arranged below the pixels irradiated with the incident light with the shortest wavelength, which are arranged per color of pixels, are the largest.

(16) A solid-state imaging device including:
a first semiconductor chip which is formed by laminating a color filter, a pixel array, a first wiring layer, and first electrode pads; and
a second semiconductor chip which is bonded to the first semiconductor chip and is formed by laminating second electrode pads, a second wiring layer, and a logic circuit, in which the first electrode pads are electrically connected to the second electrode pads at a bonding part between the first semiconductor chip and the second semiconductor chip below the pixel array, and
the first electrode pads and the second electrode pads are arranged below pixels of a color of more pixels in the pixel array, or pixels irradiated with an incident light with the longest wavelength among the incident lights transmitting through the color filter.

(17) A solid-state imaging device including:
a first semiconductor chip which is formed by laminating a pixel array, a first wiring layer, and first electrode pads; and
a second semiconductor chip which is bonded to the first semiconductor chip and is formed by laminating second electrode pads, a second wiring layer, and a logic circuit, in which the first electrode pads are electrically connected to the second electrode pads at a bonding part between the first semiconductor chip and the second semiconductor chip below the pixel array, and
the first electrode pads and the second electrode pads are arranged below all the pixels in the pixel array.

(18) The solid-state imaging device according to (17),
in which the first electrode pads and the second electrode pads are arranged on the boarders between adjacent pixels.

(19) The solid-state imaging device according to (17),
in which the pixel array forms a multi-pixel sharing structure, and further includes one floating diffusion shared by pixels in the pixel array, and
the first electrode pads and the second electrode pads are arranged below the floating diffusion.

(20) An imaging device, comprising:
a first chip including:
first and second pixels including respective first and second photoelectric conversion regions that convert incident light into electric charge, wherein the first and second pixels output pixel signals based on the electric charge; and
a first connection region for bonding the first chip to a second chip and including a first connection portion overlapped with the first photoelectric conversion region in a plan view, and a second connection portion overlapped with the second photoelectric conversion region in the plan view;
wherein the first photoelectric region receives incident light of a first wavelength, and the second photoelectric conversion region receives incident light of a second wavelength that is greater than the first wavelength,
wherein, in the plan view, the first connection portion overlaps an area of the first photoelectric conversion region that is larger than an area of the second photoelectric conversion region overlapped by the second connection portion.

(21) The imaging device of (20), further comprising:
the second chip, wherein the second chip is bonded to the first chip and includes:
logic to process the pixel signals from the first and second pixels; and
a second connection region including a third connection portion overlapped with the first photoelectric conversion region in the plan view, and a fourth connection portion overlapped with the second photoelectric conversion region in the plan view,
wherein the first connection portion is bonded to the third connection portion, and the second connection portion is bonded to the fourth connection portion.

(22) The imaging device of (21), wherein the first, second, third, and fourth connection portions are bonding pads.

(23) The imaging device of (22), wherein the bonding pads include copper.

(24) The imaging device of claim 22), wherein one of the first connection portion and the second connection portion is a dummy bonding pad.

(25) The imaging device of claim 21), wherein the first, second, third, and fourth connection portions each include a plurality of connection portions.

(26) The imaging device of (20), wherein the first photoelectric conversion region and the second photoelectric conversion region share a floating diffusion.

(27) The imaging device of (26), wherein the first chip includes:
a wiring between the first connection portion and the first photoelectric conversion region, wherein the wiring is coupled to a node that receives a voltage to adjust a parasitic capacitance of the floating diffusion.

(28) The imaging device of (20), wherein the first wavelength corresponds to blue light, and the second wavelength corresponds to red or green light.

(29) The imaging device of (20), wherein the pixel and the second pixel are part of a plurality of pixels arranged in a matrix at a central region of the first chip, and wherein the first connection portion and the second connection portion are part of a plurality of connection portions arranged in a matrix at the central region of the first chip.

(30) An imaging device, comprising:
a first chip including:
first and second pixels including respective first and second photoelectric conversion regions that convert incident light into electric charge, wherein the first and second pixels output pixel signals based on the electric charge; and
a first connection region for bonding the first chip to a second chip and including a plurality of first connection portions overlapped with the first photoelectric conversion region in a plan view, and a plurality of second connection portions overlapped with the second photoelectric conversion region in the plan view;
wherein the first photoelectric conversion region receives incident light of a first wavelength and the second photoelectric conversion region receives incident light of a second wavelength that is greater than the first wavelength, and
wherein a number of the first plurality of connection portions is greater than a number of the second plurality of connection portions.

(31) The imaging device of (30), further comprising:
the second chip, wherein the second chip is bonded to the first chip and includes:
logic to process the pixel signals from the first and second pixels; and
a second connection region including a plurality of third connection portions overlapped with the first photoelectric conversion region in the plan view, and a plurality of fourth connection portions overlapped with the second photoelectric conversion region in the plan view,
wherein the first plurality of connection portions are bonded to the third plurality of connection portions, and the plurality of second connection portions are bonded to the plurality of fourth connection portions.

(32) The imaging device of claim 31), wherein the first and third connection portions have different sizes than the second and fourth connection portions.

(33) The imaging device of (30), wherein the first wavelength corresponds to blue light, and the second wavelength corresponds to red or green light.

(34) An imaging device, comprising:
a first chip including:
first and second pixels including respective first and second photoelectric conversion regions that convert incident light into electric charge and that output pixel signals based on the electric charge; and
a first connection region for bonding to a second chip and including a first connection portion overlapped with the first photoelectric conversion region and the second photo-electric conversion region in a plan view,
wherein the first photoelectric conversion region converts incident light of a first wavelength and the second photoelectric conversion region converts incident light of a second wavelength that is greater than the first wavelength, and
wherein the first connection portion overlaps at least a part of the first photoelectric conversion region and at least a part of the second photoelectric conversion region.

(35) The imaging device of (34), further comprising:
the second chip, wherein the second chip is bonded to the first chip and includes: logic to process the pixel signals from the first and second pixels; and
a second connection region including a second connection portion overlapped with the first photoelectric conversion region and the second electric conversion region in the plan view,
wherein the first connection portion is bonded to the second connection portion.

(36) The imaging device of (34), wherein the first wavelength corresponds to blue light, and the second wavelength corresponds to red or green light.

(37) The imaging device of (34), wherein a first part of the first connection portion overlaps the first photoelectric conversion region, a second part of the first connection portion overlaps the second photoelectric conversion region, and the first part of the first connection portion is larger than the second part of the first connection portion in the plan view.

(38) An imaging device, comprising:
a first chip including:
first and second pixels including respective first and second photoelectric conversion regions that convert incident light into electric charge, wherein the first and second pixels output pixel signals based on the electric charge; and
a first connection region for bonding the first chip to a second chip and including a first connection portion overlapped with the first photoelectric conversion region in a plan view, and a second connection portion overlapped with the second photoelectric conversion region in the plan view;

wherein the first photoelectric region and the second photoelectric conversion region receive incident light of a first wavelength, and wherein, in the plan view, the first connection portion overlaps an area of the first photoelectric conversion region that is the same as an area of the second photoelectric conversion region overlapped by the second connection portion.

(39) The imaging device of (38), wherein, in the plan view, the first connection portion and the second connection portion are the same size.

(40) The imaging device of (38), wherein the first wavelength corresponds to blue light.

(41) The imaging device of (38), wherein the first chip further comprises:

third and fourth pixels including respective third and fourth photoelectric conversion regions that convert incident light into electric charge, wherein the third and fourth pixels output pixel signals based on the electric charge;

wherein the third photoelectric region receives incident light of a second wavelength, and the fourth photoelectric conversion region receives incident light of a third wavelength, and wherein, in the plan view, the first connection portion does not overlap the third photo-electric conversion region and the fourth photoelectric conversion region.

(42) The imaging device of (41), the second wavelength corresponds to red light and the third wavelength corresponds to green light.

REFERENCE SIGNS LIST 1, 1a to 1c, 41, 51, 61, 141, 241 Solid-state imaging device
2 Pixel
3, 23 Pixel array (pixel region)
4 Vertical drive circuit
5 Column signal processing circuit
6 Horizontal drive circuit
7 Output circuit
8, 24, 24-1, 24-2 Control circuit
9 Vertical signal line (VSL)
10 Horizontal signal line
12 I/O terminal
21, 64, 74, 144, 184, 244 First semiconductor substrate
22, 65, 75 Second semiconductor substrate
25, 46 Logic circuit
31, 42, 62, 72, 131, 142, 150, 182, 190, 242 First semiconductor chip part (upper chip)
32 Pixel array region
34 Cu—Cu electrode bonding region (CC bonding region)
35, 36 Vertical signal line (VSL)
38 Pixel
41 CMOS image sensor (CIS)
43, 63, 73, 143, 183, 243 Second semiconductor chip part (lower chip)
44, 81, 91, 101, 111, 121, 151, 161, 171, 191, 201, 211, 221, 231 Pixel array
45 AD converter
48 Conductive via
49, 52, 86, 87, 112, 122, 152, 153, 162, 163, 172, 173, 196, 197, 202, 203, 212, 226 to 229, 232 to 235 Cu—Cu electrode bonding part (CC bonding part)
66, 76, 146, 186, 246 Color filter
67, 77, 147, 187, 247 On-chip lens
78 Insulative film
79 Planarization film
82, 223 Red pixel
83, 84, 224 Green pixel
85, 225 Blue pixel
92, 102, 213, 1410 Floating diffusion (FD)
192 to 195, 222 Monochrome pixel
701, 705, 2401, 2405 Multilayered wiring layer
602, 702, 1402, 1412, 1802, 2402 First electrode pad (first conductive body)
702d, 706d Dummy pad
703, 707 Conductive via
704, 708 Inter-layer insulative film
606, 706, 1406, 1416, 1806, 2406 Second electrode pad (second conductive body)
609, 709, 1409, 1809, 2409 Bonding face
710 Semiconductor well region
1411 Light shield wiring
Tr1, Tr2 Transistor
301 Camera
302 Solid-state imaging device
303 Optical system
304 Shutter device
305 Drive circuit
306 Signal processing circuit

What is claimed is:

1. An imaging device, comprising:
a first chip, including:
first, second, third, and fourth pixels including respective first, second, third, and fourth photoelectric conversion regions that convert incident light into electric charge, wherein the first, second, third, and fourth pixels output pixel signals based on the electric charge; and
a first connection region for bonding the first chip to a second chip and including a first connection portion overlapped with the first photoelectric conversion region in a plan view, and a second connection portion overlapped with the second photoelectric conversion region in the plan view,
wherein the first photoelectric conversion region receives incident light of a first wavelength, and the second photoelectric conversion region receives incident light of a second wavelength that is greater than the first wavelength,
wherein, in the plan view, an area of the first connection portion is larger than an area of the second connection portion, and
wherein, in the plan view, the first connection region does not overlap the third photoelectric conversion region or the fourth photoelectric conversion region.

2. The imaging device of claim 1, further comprising:
a logic circuit, included in the second chip, to process the pixel signals from the first, second, third, and fourth pixels; and
a second connection region including a third connection portion overlapped with the first photoelectric conversion region in the plan view, and a fourth connection portion overlapped with the second photoelectric conversion region in the plan view,
wherein the first connection portion is bonded to the third connection portion, and the second connection portion is bonded to the fourth connection portion.

3. The imaging device of claim 2, wherein the first, second, third, and fourth connection portions are bonding pads.

4. The imaging device of claim 3, wherein the bonding pads include copper.

5. The imaging device of claim 3, wherein one of the first connection portion and the second connection portion is a dummy bonding pad.

6. The imaging device of claim 2, wherein the first, second, third, and fourth connection portions each include a plurality of connection portions.

7. The imaging device of claim 1, wherein the first photoelectric conversion region and the second photoelectric conversion region share a floating diffusion.

8. The imaging device of claim 7, wherein the first chip includes:
   a wiring between the first connection portion and the first photoelectric conversion region, and wherein the wiring is coupled to a node that receives a voltage to adjust a parasitic capacitance of the floating diffusion.

9. The imaging device of claim 1, wherein the first wavelength corresponds to blue light, and the second wavelength corresponds to red or green light.

10. The imaging device of claim 1, wherein the first pixel, the second pixel, the third pixel, and the fourth pixel are part of a plurality of pixels arranged in a matrix at a central region of the first chip, and wherein the first connection portion and the second connection portion are part of a plurality of connection portions arranged in the matrix at the central region of the first chip.

* * * * *